(12) United States Patent
Hara et al.

(10) Patent No.: US 9,065,419 B2
(45) Date of Patent: Jun. 23, 2015

(54) LADDER FILTER, DUPLEXER AND MODULE

(75) Inventors: Motoaki Hara, Miyagi (JP); Shogo Inoue, Tokyo (JP); Jun Tsutsumi, Tokyo (JP); Masafumi Iwaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 529 days.

(21) Appl. No.: 13/466,319

(22) Filed: May 8, 2012

(65) Prior Publication Data

US 2012/0286895 A1 Nov. 15, 2012

(30) Foreign Application Priority Data

May 11, 2011 (JP) ................. 2011-106719

(51) Int. Cl.
*H03H 9/64* (2006.01)
*H03H 9/05* (2006.01)
*H03H 9/54* (2006.01)
*H03H 9/60* (2006.01)
*H03H 9/72* (2006.01)
*H03H 9/00* (2006.01)
*H03H 9/10* (2006.01)

(52) U.S. Cl.
CPC .......... *H03H 9/0566* (2013.01); *H03H 9/0023* (2013.01); *H03H 9/1085* (2013.01); *H03H 9/542* (2013.01); *H03H 9/605* (2013.01); *H03H 9/6483* (2013.01); *H03H 9/725* (2013.01)

(58) Field of Classification Search
CPC ......... H03H 9/64; H03H 9/6483; H03H 9/72; H03H 9/725
USPC .......................................... 333/133, 193–196
See application file for complete search history.

(56) References Cited

U.S. PATENT DOCUMENTS

| | | | |
|---|---|---|---|
| 6,369,672 B1 * | 4/2002 | Ikada ............................. | 333/193 |
| 6,909,338 B2 * | 6/2005 | Omote .......................... | 333/133 |
| 6,995,631 B2 * | 2/2006 | Taniguchi ..................... | 333/133 |
| 7,034,638 B2 * | 4/2006 | Yamamoto et al. ........... | 333/193 |

(Continued)

FOREIGN PATENT DOCUMENTS

| | | |
|---|---|---|
| JP | 2003-69382 A | 3/2003 |
| JP | 2003-110404 A | 4/2003 |

(Continued)

OTHER PUBLICATIONS

Japanese Office Action dated Dec. 9, 2014, in a counterpart Japanese patent application No. 2011-106719.

*Primary Examiner* — Dean Takaoka
(74) *Attorney, Agent, or Firm* — Chen Yoshimura LLP

(57) ABSTRACT

A ladder filter includes at least one series resonator connected in series between an input terminal and an output terminal, at least one parallel resonator connected in parallel with the at least one series resonator, and an inductor connected in parallel with the at least one series resonator. The at least one series resonator and the inductor generate a first attenuation pole at a frequency equal to or lower than a frequency band defined by the at least one series resonator and the at least one parallel resonator. The first attenuation pole is located at a frequency that is equal to or higher than a resonance frequency of a parallel resonator that is included in the at least one parallel resonator and has a highest resonance frequency and that is equal to or lower than a high-frequency end of the pass band.

17 Claims, 27 Drawing Sheets

(56) References Cited

U.S. PATENT DOCUMENTS

| | | | |
|---|---|---|---|
| 8,648,670 B2 * | 2/2014 | Hara et al. | 333/133 |
| 2003/0062969 A1 | 4/2003 | Inoue | |
| 2003/0214368 A1 | 11/2003 | Taniguchi | |
| 2004/0140866 A1 | 7/2004 | Taniguchi | |
| 2007/0024392 A1 | 2/2007 | Inoue et al. | |
| 2009/0322444 A1 | 12/2009 | Tanaka | |
| 2011/0227807 A1 | 9/2011 | Iwaki et al. | |
| 2012/0274421 A1 * | 11/2012 | Hara et al. | 333/195 |
| 2014/0111287 A1 * | 4/2014 | Hara et al. | 333/133 |

FOREIGN PATENT DOCUMENTS

| | | |
|---|---|---|
| JP | 2003-332885 A | 11/2003 |
| JP | 2004-135322 A | 4/2004 |
| JP | 2004-242281 A | 8/2004 |
| JP | 2007-36856 A | 2/2007 |
| JP | 2009-296167 A | 12/2009 |
| JP | 2010-11300 A | 1/2010 |
| WO | 2010/061477 A1 | 6/2010 |

* cited by examiner

R

R

R

R          L

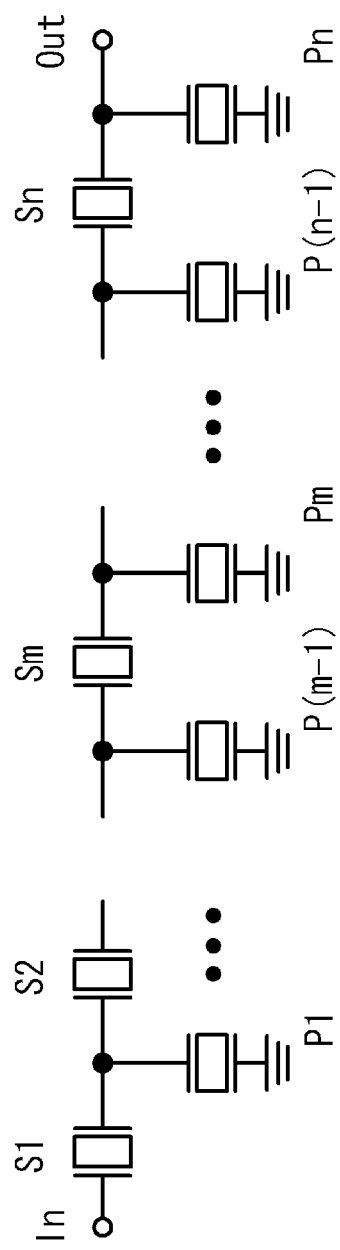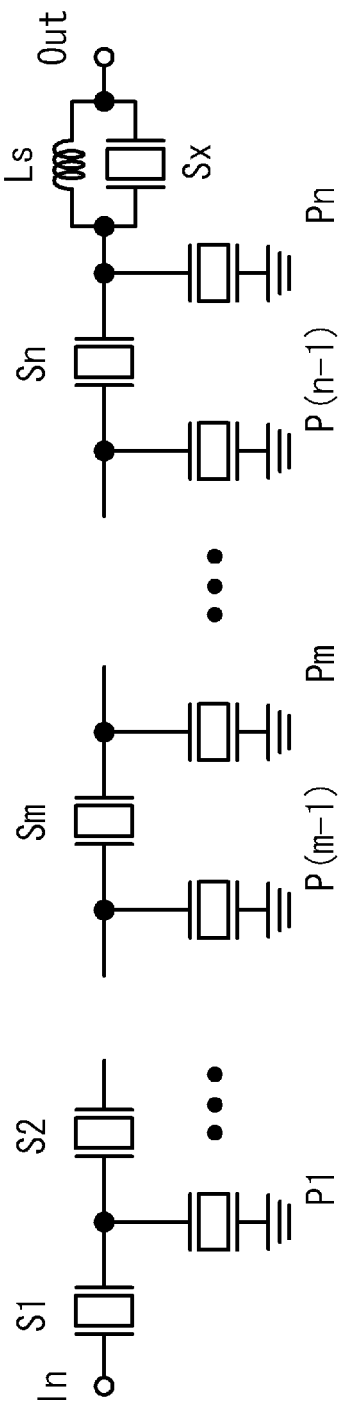
FIG. 6A
FIG. 6B

FILTER F11 - - - -
FILTER F12 ———

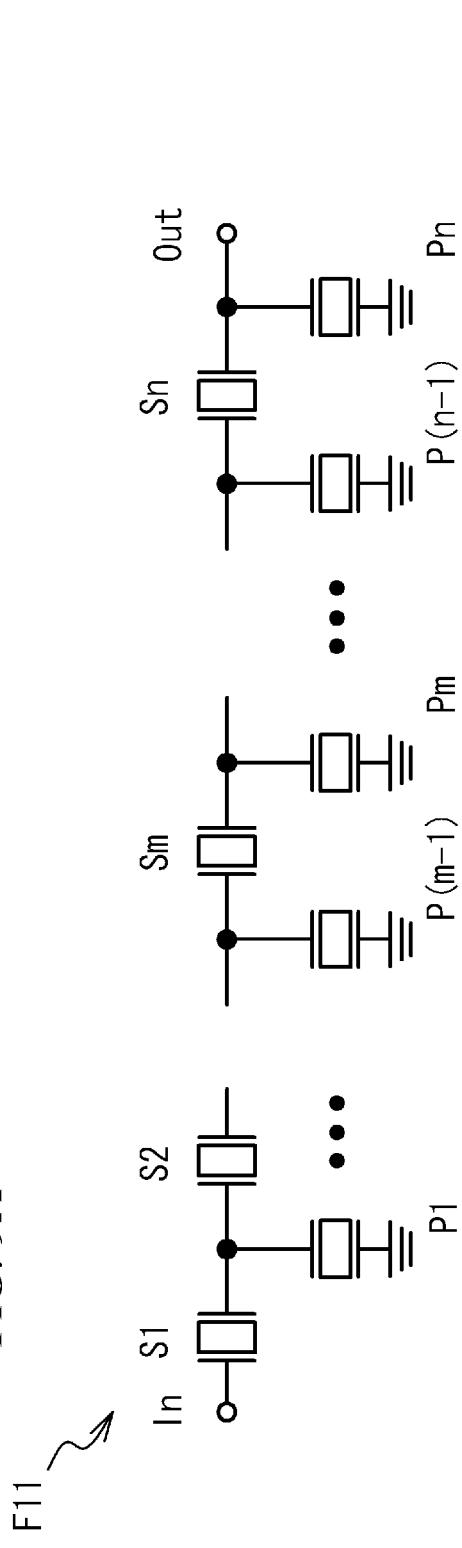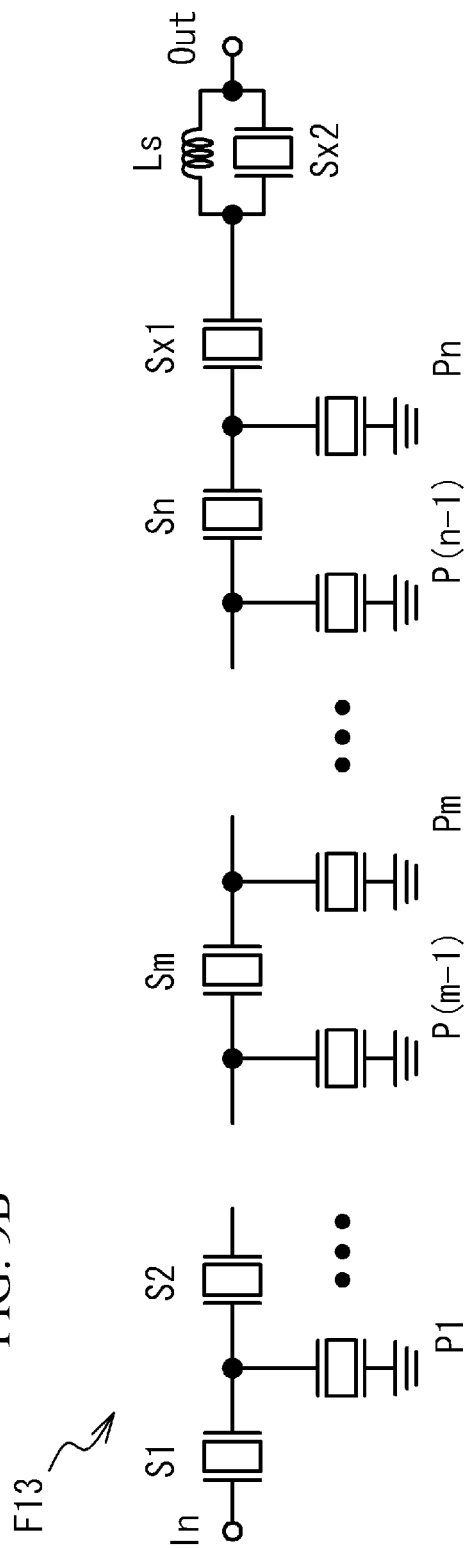

FILTER F11 — — —
FILTER F13 ⎯⎯⎯

FILTER F11 — — — —
FILTER F14 ———————

FILTER F11 ----
FILTER F15 ———

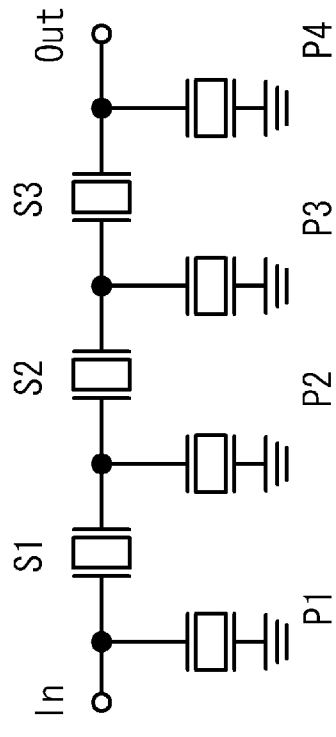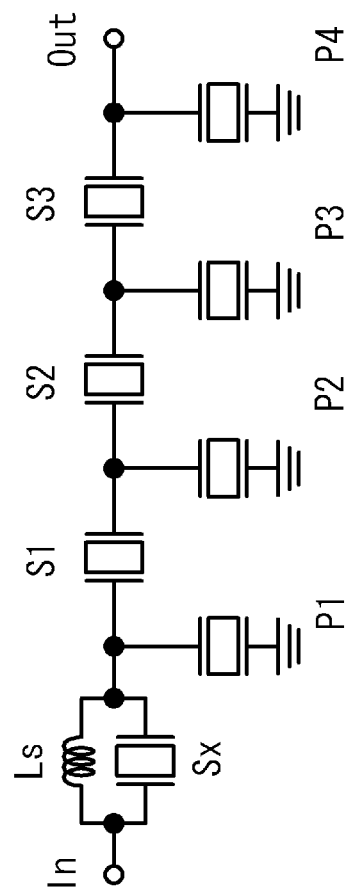

LADDER FILTER, DUPLEXER AND MODULE

CROSS-REFERENCE TO RELATED APPLICATION

This application is based upon and claims the benefit of priority of the prior Japanese Patent Application No. 2011-106719, filed on May 11, 2011, the entire contents of which are incorporated herein by reference.

FIELD

A certain aspect of the present invention relates to ladder filters, duplexers and modules.

BACKGROUND

Recently, portable telephones and portable information terminals have rapidly spread due to the development of mobile communication systems. Thus, there is an increasing demand for RF (Radio Frequency) filters, particularly, those having a compact size and a sharp characteristic. The filters are required to generate an attenuation pole and have sufficient suppression over a broad area in order to handle a new communication system. Such filters may be a ladder filter in which multiple resonators are connected. A duplexer or module equipped with filters is required to have transmission and reception filters configured so that the transmission filter has high suppression in the pass band of the reception filter and the reception filter has high suppression in the pass band of the transmission filter. There is a proposal of a filter equipped with an inductor in order to adjust the filter characteristics.

Japanese Patent Application Publication No. 2009-296167 (Document 1) discloses an art in which an inductor is connected in parallel with a series resonator and results in an attenuation pole at a high-frequency side of the pass band. Japanese Patent Application Publication No. 2010-11300 (Document 2) discloses an art in which an inductor and a capacitor are connected to a resonator to generate an attenuation pole outside of the pass band.

SUMMARY

According to an aspect of the present invention, there are provided a ladder filter, a duplexer and a module having high suppression over a broad area.

According to another aspect of the present invention, there is provided a ladder filter including: at least one series resonator connected in series between an input terminal and an output terminal; at least one parallel resonator connected in parallel with the at least one series resonator; and an inductor connected in parallel with the at least one series resonator, the at least one series resonator and the inductor generating a first attenuation pole at a frequency equal to or lower than a frequency band defined by the at least one series resonator and the at least one parallel resonator, the first attenuation pole being located at a frequency that is equal to or higher than a resonance frequency of a parallel resonator that is included in the at least one parallel resonator and has a highest resonance frequency and that is equal to or lower than a high-frequency end of the pass band.

BRIEF DESCRIPTION OF THE DRAWINGS

FIG. 6A is a circuit diagram of a filter F11, and FIG. 6B is a circuit diagram of a filter F12;

FIG. 9A is a circuit diagram of the filter F11, and FIG. 9B is a circuit diagram of a filter F13;

FIG. 15A is a circuit diagram of a filter F16a, and FIG. 15B is a circuit diagram of a filter F16;

DETAILED DESCRIPTION

Figure 1A:
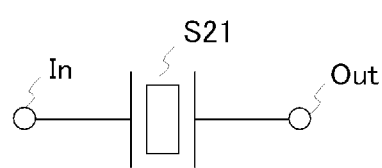
FIG. 1A is a circuit diagram of a series resonator.
Figure 1B:
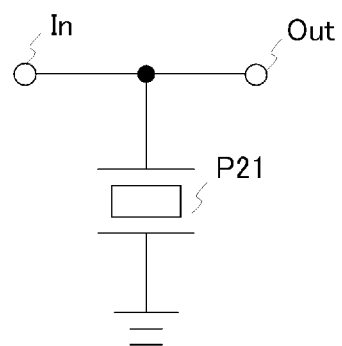
FIG. 1B is a circuit diagram of a parallel resonator.

A ladder filter is now described. FIG. 1A is a circuit diagram of a series resonator, FIG. 1B is a circuit diagram of a parallel resonator, and FIG. 1C is a diagram of a pass characteristic of the series resonator and that of the parallel resonator.

As illustrated in FIG. 1A, the series resonator has a resonator S21 having a pair of ports (signal terminals), one of which is an input terminal In and the other is an output terminal Out. As illustrated in FIG. 1B, the parallel resonator has a resonator P21 having a pair of ports, one of which is connected to a ground terminal and the other is connected to a short-circuit line between the input terminal In and the output terminal Out.

Figure 1C:
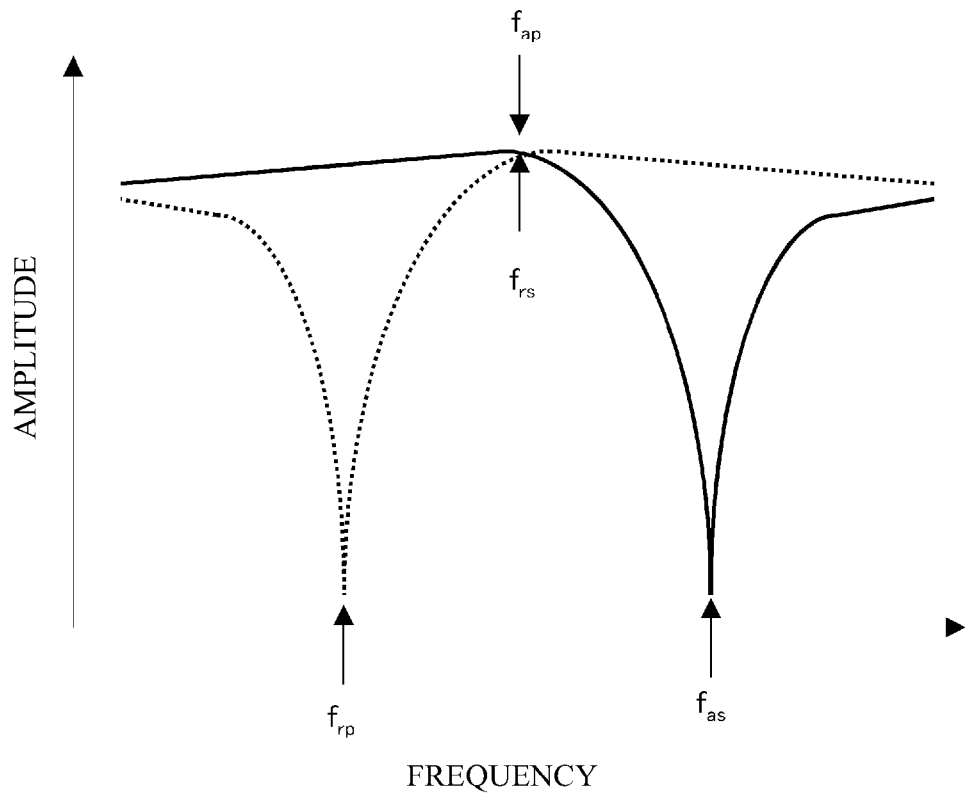
FIG. 1C is a diagram of a pass characteristic of the series resonator and that of the parallel resonator.

The horizontal axis of FIG. 1C denotes the frequency, and the vertical axis thereof denotes the amplitude or magnitude. The pass characteristic of the series resonator is indicated by a solid line, and that of the parallel resonator is indicated by a broken line. As illustrated in FIG. 1C, the pass characteristic of the series resonator has one resonance point (resonance frequency) $f_{rs}$ and one anti-resonance point (anti-resonance frequency) $f_{as}$. The amplitude is the largest at the resonance point $f_{rs}$, and is the smallest at the anti-resonance point $f_{as}$. The pass characteristic of the parallel resonator has one resonance point $f_{rp}$ and one anti-resonance point $f_{ap}$. The amplitude is the smallest at the resonance point $f_{rp}$ and is the largest at the anti-resonance point $f_{ap}$.

Figure 2A:
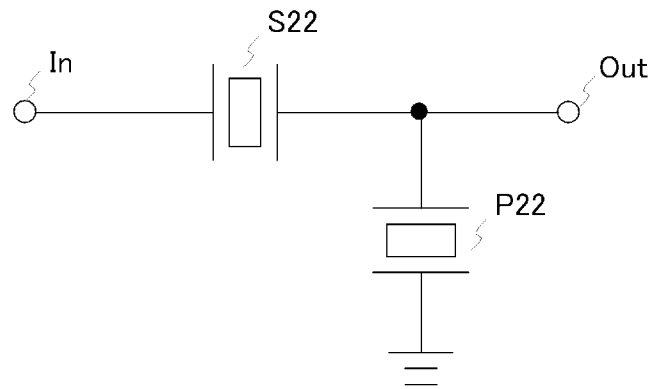
FIG. 2A is a circuit diagram of a single-stage ladder filter.
Figure 2B:
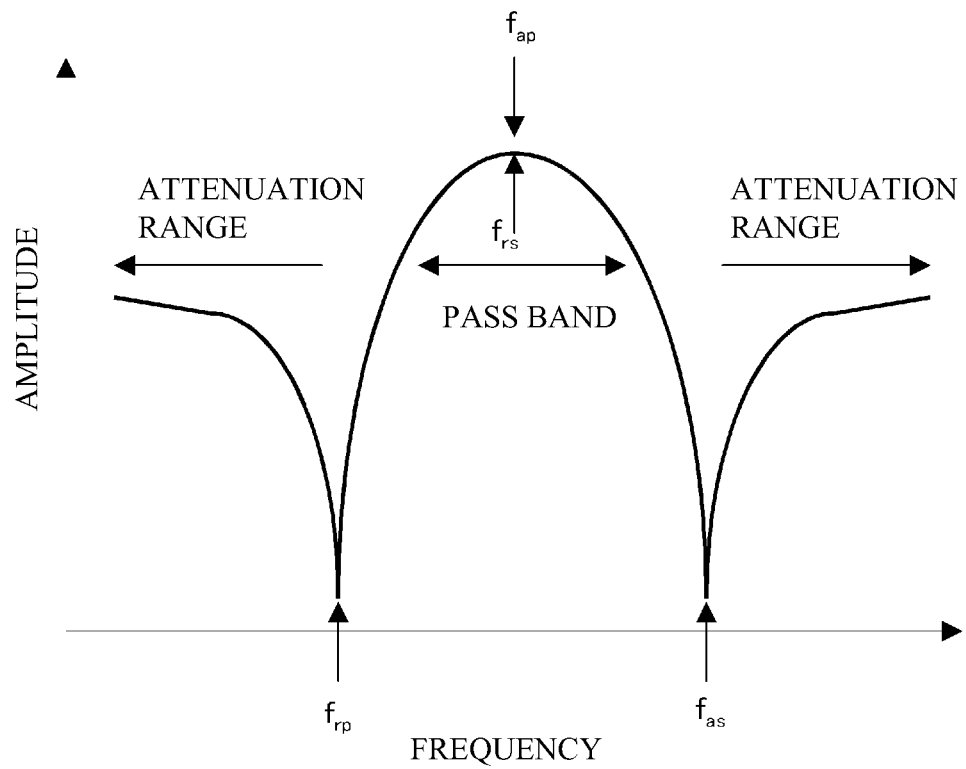
FIG. 2B is a diagram of a pass characteristic of the single-stage ladder filter.

FIG. 2A is a circuit diagram of a single-stage ladder filter, and FIG. 2B illustrates a pass characteristic of the ladder filter illustrated in FIG. 2A.

As illustrated in FIG. 2A, a series resonator S22 is connected in series to the input terminal In and the output terminal Out, and a parallel resonator P22 is connected between the output terminal Out and ground. The resonance point $f_{rs}$ of the series resonator S22 and the anti-resonance point $f_{ap}$ of the parallel resonator P22 are designed to be approximately equal to each other.

The horizontal axis of FIG. 2B is the frequency, and the vertical axis thereof is the amplitude. The ladder filter in FIG. 2A has a pass characteristic as illustrated in FIG. 2B, which is a combination of the pass characteristic of the series resonator and that of the parallel resonator. The amplitude is the largest around the resonance point $f_{rs}$ of the series resonator S22 and the anti-resonance point $f_{ap}$ of the parallel resonator P22, and is the smallest around the anti-resonance point $f_{as}$ of the series resonator S22 and the resonance point $f_{rp}$ of the parallel resonator P22. The ladder filter in FIG. 2A has a pass band between the resonance frequency $f_{rp}$ of the parallel resonator P22 and the anti-resonance point $f_{as}$ of the series resonator S22, and has an attenuation range equal to or lower than the resonance frequency $f_{rp}$ of the parallel resonator P22 and that equal to or higher than the anti-resonance point $f_{as}$ of the series resonator S22. Thus, the ladder filter functions as a bandpass filter. The frequency $f_{up}$ at the high-frequency end of the pass band is the frequency $f_{as}$ of the anti-resonance point (anti-resonance frequency) of the series resonator S22. The frequency $f_{down}$ of the low-frequency end of the pass band is the frequency of the resonance point (resonance frequency) $f_{rp}$ of the parallel resonator P22.

Figure 3A:
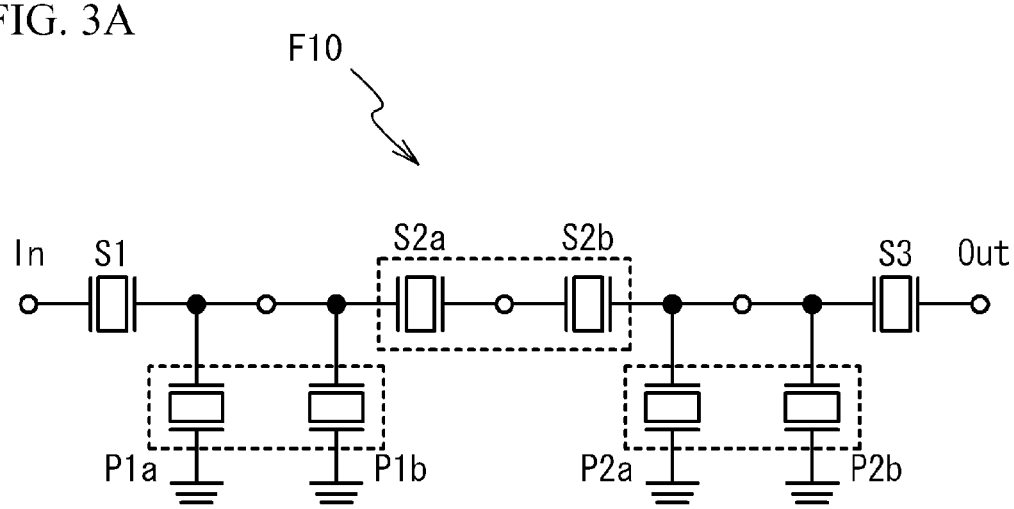
FIGS. 3A and 3B are circuit diagrams of multi-stage ladder filters.
Figure 3B:
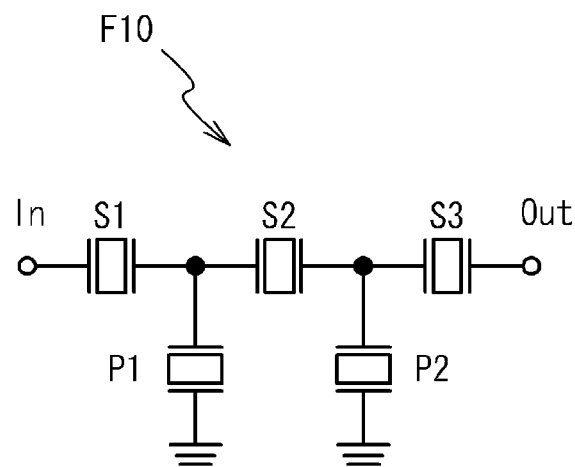

A description is now given of a multistage ladder filter. FIGS. 3A and 3B are circuit diagrams of configurations of a multistage ladder filter.

As illustrated in FIG. 3A, a ladder filter F10 includes series resonators S1, S2a, S2b and S3, and parallel resonators P1a, P1b, P2a and P2b. The series resonators S1, S2a, S2b and S3 are connected in series between an input terminal In and an output terminal Out. The series resonator S1 is connected to the input terminal In. The series resonator S4 is connected to the output terminal Out.

The parallel resonators P1a and P1b are connected in parallel with each other between the series resonators S1 and S2a. The parallel resonators P2a and P2b are connected in parallel with each other between the series resonators S2b and S3. The parallel resonators P1a, P1b, P2a and P2b are connected to ground. The multistage ladder filter F10 is configured by connecting a plurality of single-stage ladder filters. In order to suppress signal reflection between the stages, the adjacent single-stage ladders are connected so as to be mutually inverted.

As illustrated in FIG. 3B, for the purpose of downsizing the filter, the series resonators S2a and S2b may be incorporated into a single series resonator S2. Further, the parallel resonators P1a and P1b may be incorporated into a single parallel resonator P1, and the parallel resonators P2a and P2b may be incorporated into a single parallel resonator P2. That is, each block surrounded by broken lines may be formed by a single resonator.

An inductor may be connected to adjust the characteristics such as generation of attenuation pole or extension of the pass band. An exemplary connection of an inductor to a resonator is now described.

Figure 4A:
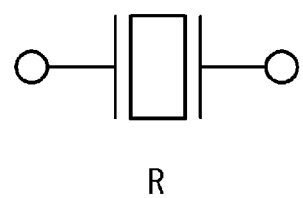
FIG. 4A is a diagram of a resonator.
Figure 4B:
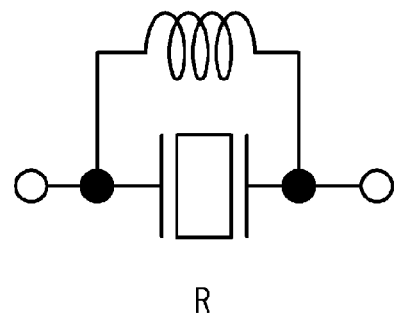
FIG. 4B is a diagram of a resonator with which an inductor is connected in parallel.
Figure 4C:
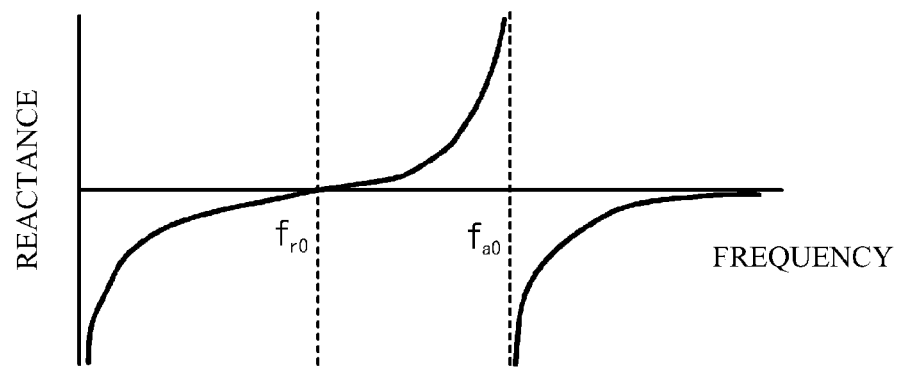
FIG. 4C is a diagram of a schematic reactance characteristic of the resonator in FIG. 4A.
Figure 4D:
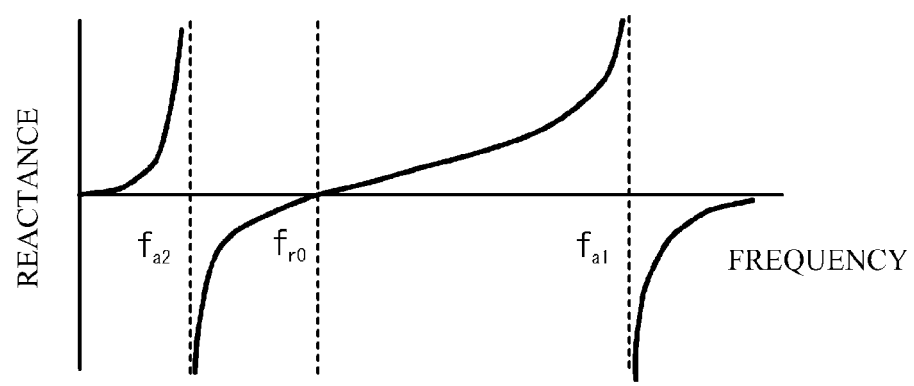
FIG. 4D is a diagram of a schematic reactance characteristic of the resonator with the inductor in FIG. 4B.

FIG. 4A is a diagram of a resonator R, and FIG. 4B is a diagram of the resonator R with which an inductor L is connected in parallel. FIG. 4C is a diagram of a schematic reactance characteristic of the resonator R depicted in FIG. 4A, and FIG. 4D is a diagram of a schematic reactance characteristic of the resonator R with which the inductor L is connected in parallel depicted in FIG. 4B. The horizontal axes of FIGS. 4C and 4D are the frequency, and the vertical axes thereof are the reactance.

When the resistance component of the resonator R is sufficiently small, the reactance component of the resonator greatly influences the impedance of an element including the resonator R. Thus, the reactance in FIGS. 4C and 4D indicates a difficulty in flowing through the resonator R or the combination of the resonator R and the inductor L.

As illustrated in FIG. 4C, the resonator R of FIG. 4A has a resonance point at a frequency $f_{ro}$, and an anti-resonance point at a frequency $f_{ao}$ higher than the frequency $f_{ro}$. The resonator R is in the open state at the direct current point (the frequency is zero).

As illustrated in FIG. 4B, when the inductor L is connected to the resonator R, the reactance is changed. As illustrated in FIG. 4D, the anti-resonance point shifts from the frequency $f_{ao}$ to a higher frequency $f_{a1}$. An anti-resonance point is generated at a frequency $f_{a2}$ lower than the frequency $f_{ro}$ at the resonance point. At the direct current point, the resonator R and the inductor L are in the short-circuited state. In other words, the reactance is zero or around zero.

Figure 5A:
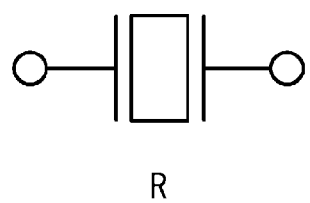
FIG. 5A is a diagram of a resonator.
Figure 5B:
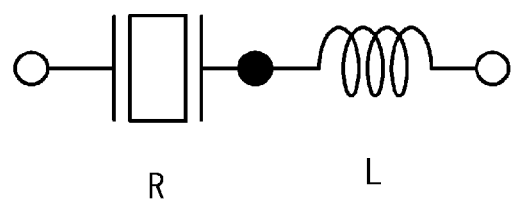
FIG. 5B is a diagram of a resonator to which an inductor is connected in series.
Figure 5C:
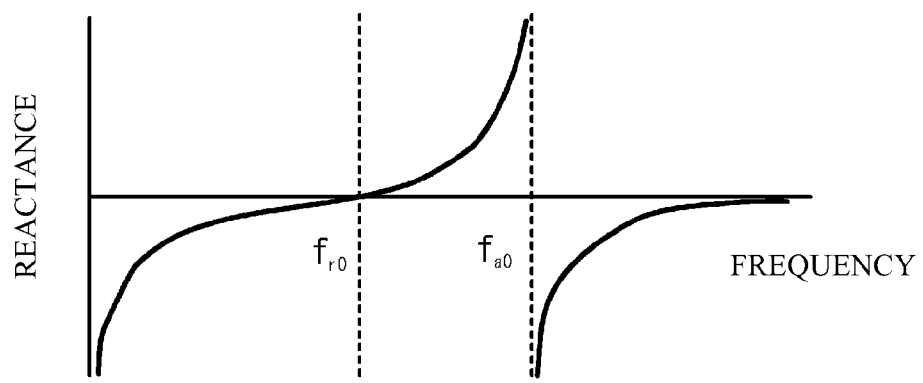
FIG. 5C is a diagram of a schematic reactance characteristic of the resonator in FIG. 5A.
Figure 5D:
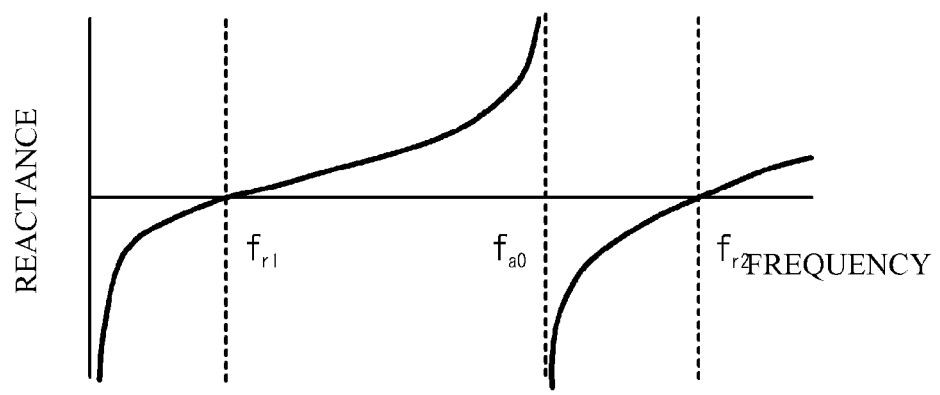
FIG. 5D is a diagram of a schematic reactance characteristic of the resonator with the inductor in FIG. 5B.

FIG. 5A is a diagram of the resonator R, and FIG. 5B is a diagram of the resonator R to which the inductor L is connected in series. FIG. 5C is a diagram of a schematic reactance characteristic of the resonator R depicted in FIG. 5A, and FIG. 5D is a diagram of a schematic reactance characteristic of the resonator R to which the inductor L is connected in series as depicted in FIG. 5B. The horizontal axes of FIGS. 5C and 5D are the frequency, and the vertical axes thereof are the reactance. Although FIGS. 5A and 5C are the same as FIGS. 4A and 4C, respectively, these figures are presented again for the convenience' sake.

As illustrated in FIG. 5B, the reactance characteristic is changed by connecting the inductor L to the resonator R in series. As illustrated in FIG. 5D, the resonance point shifts to a frequency $f_{r1}$ lower than the frequency $f_{ro}$. A new resonance point is generated at a frequency $f_{r2}$ higher than the anti-resonance frequency $f_{ao}$. At the high-frequency side, the resonator R and the inductor L are in the open state. In other words, the reactance diverges.

A description is now given of an exemplary configuration in which an inductor is connected to a ladder filter. A first exemplary configuration is to connect an inductor to a series resonator of a ladder filter in series. FIG. 6A is a circuit diagram of a filter F11, and FIG. 6B is a circuit diagram of a filter F12.

As illustrated in FIG. 6A, the filter F11 is a ladder filter composed of the input terminal In, the output terminal Out, series resonators S1~Sn, and parallel resonators P1~Pn. The series resonators S1~Sn are connected in series between the input terminal In and the output terminal Out. One end of the series resonator S1 is connected to the input terminal In, and the other is connected to one end of the series resonator S2. One end of the parallel resonator P1 is connected to a node between the series resonators S1 and S2, and the other end is grounded. Similarly, the series resonators S2~Sn and the parallel resonators P2~Pn are connected in a ladder form. One end of the series resonator Sn is connected to the output terminal Out, and one end of the parallel resonator Pn is connected to a node between the series resonator Sn and the output terminal Out. The number of stages of the filter F11 may be determined arbitrarily.

As illustrated in FIG. 6B, the filter F12 has series resonators S11~Sx. The series resonator Sx and an inductor Ls are connected in parallel with each other. One end of the series resonator Sx and one end of the inductor Ls are connected to the ends of the series resonator Sn and the parallel resonator Pn, and the other ends of Sx and Ls are connected to the output terminal Out.

Figure 7A:
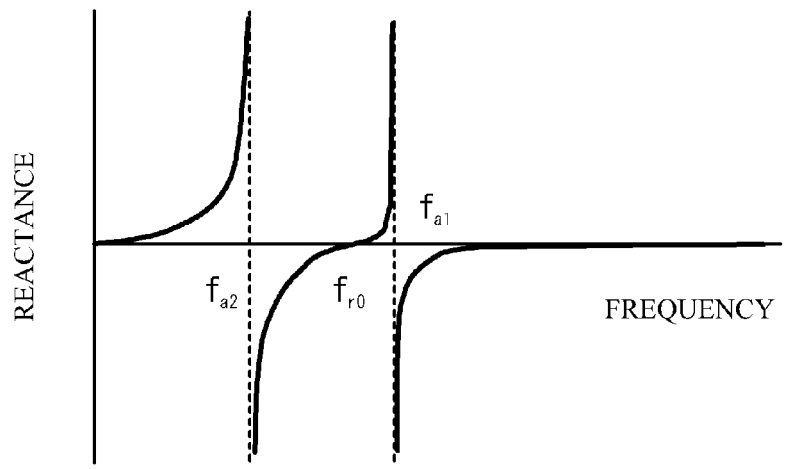
FIG. 7A is a diagram of a schematic reactance characteristic of a resonator with which an inductor is connected in parallel.
Figure 7B:
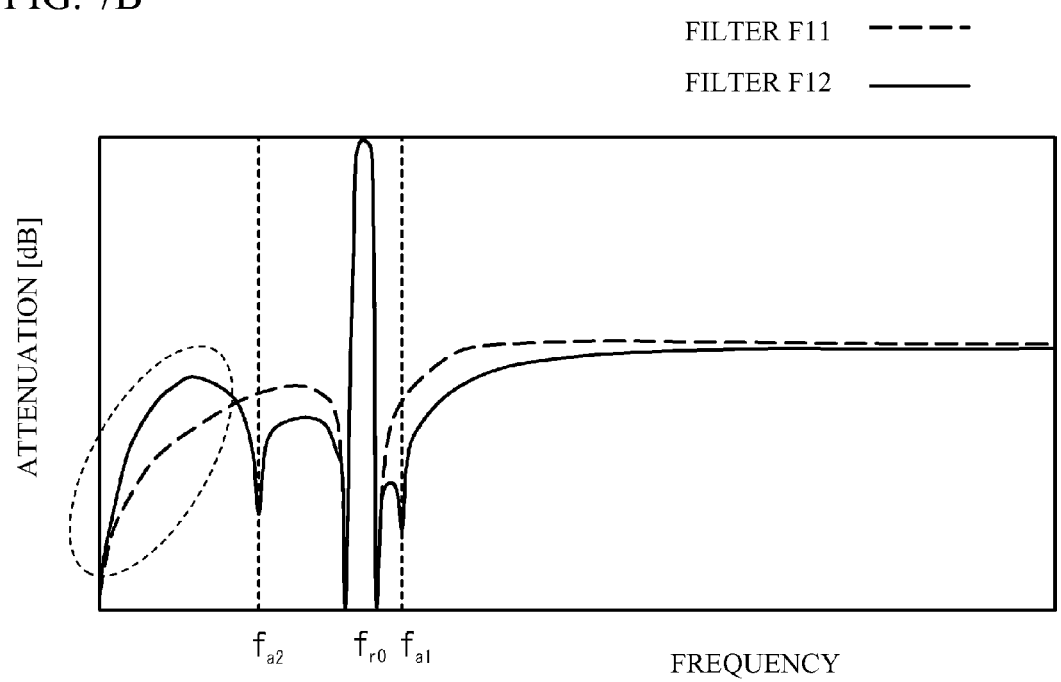
FIG. 7B is a diagram of an attenuation characteristic of a filter F12.

A description is now given of characteristics of the filter F12. FIG. 7A is a diagram of a schematic reactance characteristic of a resonator with an inductor being connected in parallel. FIG. 7B is a diagram of an exemplary attenuation characteristic of the filter F12. This attenuation characteristic is obtained by computer simulation. This holds true for attenuation characteristics described later. The scale of the horizontal axis of FIG. 7B that matches that of FIG. 7A is designed to match the scale of FIG. 4B. A broken line in FIG. 7B indicates the attenuation characteristic of the filter F11, and a solid line indicates the attenuation characteristic of the filter F12.

As illustrated in FIG. 7A, the anti-resonance point shifts to the frequency $f_{a1}$ from the frequency $f_{ao}$ illustrated in FIG. 4B. As illustrated in FIG. 7B, the above shift of the anti-resonance frequency results in an attenuation pole at the frequency $f_{a1}$. As illustrated in FIG. 7A, a new anti-resonance point is generated at the frequency $f_{a2}$. As illustrated in FIG. 7B, the new anti-resonance point generates a new attenuation pole at the frequency $f_{a2}$. As illustrated in FIG. 7A, a short-circuit takes place at the direct current point. As indicated by an ellipse depicted by a broken line in FIG. 7B, the occurrence of a short-circuit at the direct current point degrades the suppression in a frequency area lower than the frequency $f_{a2}$.

Figure 8:
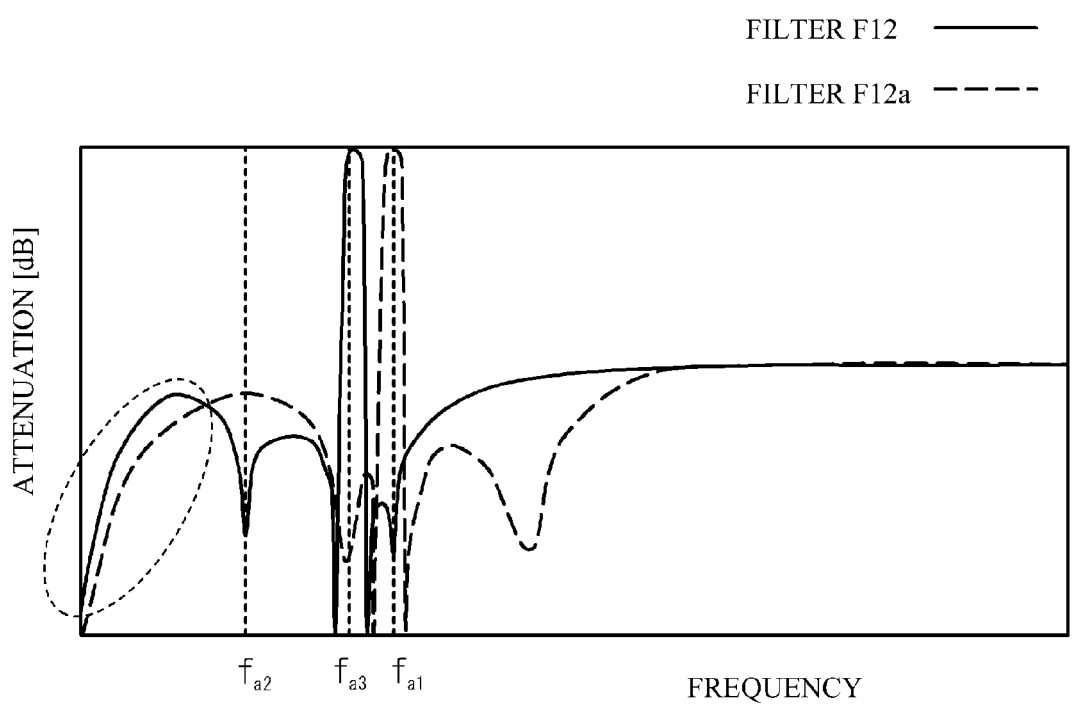
FIG. 8 is a diagram of an attenuation characteristic of two filters provided in a duplexer.

The filter F12 is applied to a duplexer, and the attenuation pole generated at the frequency fa2 is arranged in the pass band of the other filter. It is thus possible to improve the isolation characteristic of the duplexer. FIG. 8 is a diagram of attenuation characteristics of two filters of the duplexer. The duplexer includes a filter F12a and the aforementioned filter F12. Although not illustrated, the filter F12a includes a series resonator and an inductor connected in parallel with each other like the filter F12. A broken line is the attenuation characteristic of the filter F12a, and a solid line is the attenuation characteristic of the filter F12.

As illustrated in FIG. 8, the filter F12a has a pass band that is higher than that of the filter F12, and has an attenuation pole at a frequency $f_{a3}$. The attenuation pole of the filter F12 at the frequency $f_{a2}$ is located in the pass band of the filter F12a. The attenuation pole of the filter F12a at the frequency $f_{a3}$ is located in the pass band of the filter F12. Thus, high isolation can be ensured. However, as indicated by the broken-line ellipse in FIG. 8, suppression may deteriorate at the direct current point as in the case of FIG. 7B. For example, when high frequencies like the GHz band are used, degradation of the suppression in the low-frequency area may greatly damage the characteristic of the duplexer. A description is now given of an example in which a series resonator is added for the purpose of improving suppression in the low-frequency area.

FIG. 9A is a circuit diagram of an exemplary configuration of the filter F11, and FIG. 9B is a circuit diagram of an exemplary configuration of the filter F13. A description is not given here of structures that are the same as those illustrated in FIGS. 6A and 6B. Although FIG. 9A is the same as FIG. 6A, the configuration of the filter F11 in FIG. 6A is presented again as FIG. 11A for the purpose of comparison. In a later description, the configuration of the filter F11 will be presented again as FIG. 11A.

As illustrated in FIG. 9B, the filter F13 is configured by adding, to the filter F11, series resonators Sx1 and Sx2 and an inductor Ls. That is, the filter F13 is configured by adding a series resonator to the filter F12. One end of the series resonator Sx1 is connected to one end of the series resonator Sn i, and the other end of the series resonator Sx1 is connected to one end of the series resonator Sx2 and one end of the inductor Ls. The series resonator Sx and the inductor Ls are connected in parallel with each other. The other end of the series resonator Sx2 and the other end of the inductor Ls are connected to the output terminal Out.

Figure 10A:
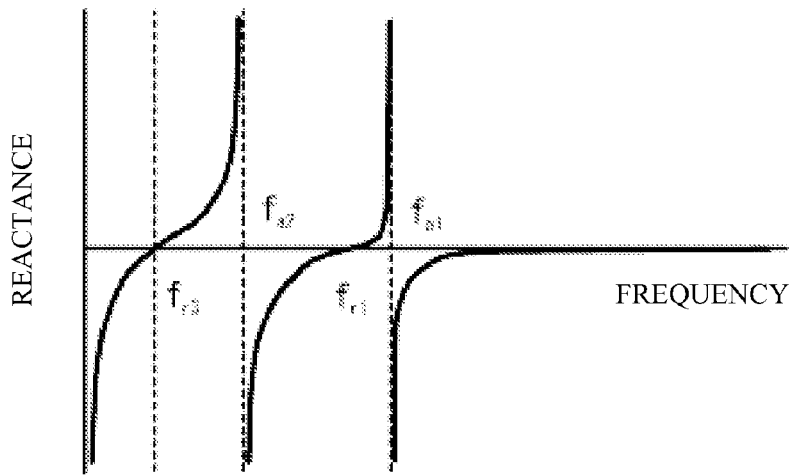
FIG. 10A is a diagram of a schematic reactance characteristic of series resonators Sx1 and Sx2 and an inductor L1.
Figure 10B:
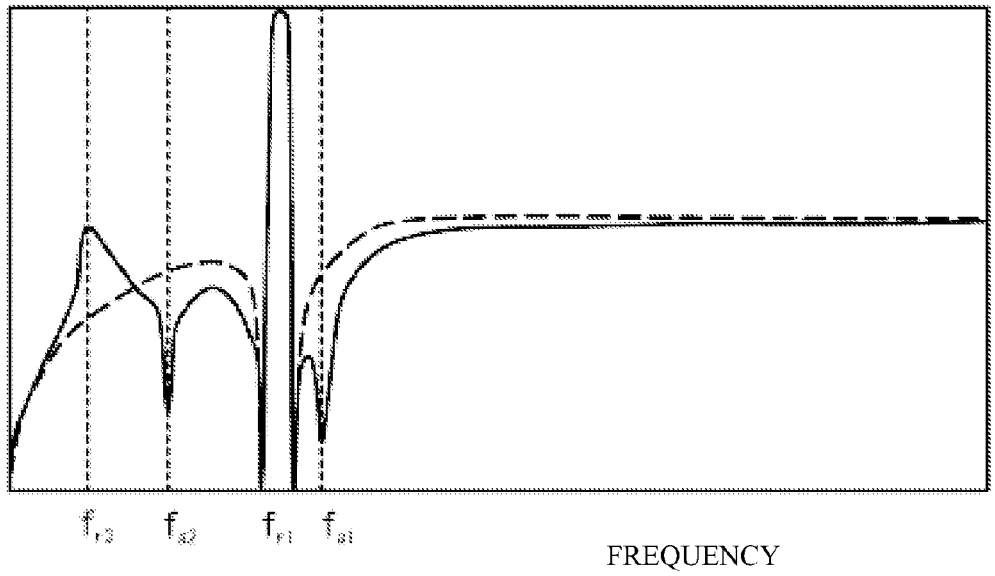
FIG. 10B is a diagram of a schematic reactance characteristic of the filter F13.

A description is now given of a characteristic of the filter F13. FIG. 10A is a schematic reactance characteristic of the series resonators Sx1 and Sx2 and the inductor Ls. FIG. 10B is a schematic attenuation characteristic of the filter F13. A broken line in FIG. 10B indicates the attenuation characteristic of the filter F11, and a solid line indicates the attenuation characteristic of the filter F13.

As illustrated in FIG. 10A, resonance points are generated at a frequency $f_{r1}$ and a frequency $f_{r3}$ lower than the frequency $f_{r1}$. At frequencies $f_{a1}$ and $f_{a2}$, anti-resonance points are generated. In other words, a new resonance point located at the frequency $f_{r3}$ is generated by connecting the series resonator Sx2 and the inductor Ls in parallel with each other and further connecting the series resonator Sx1 in series. Around the direct current point, the series resonators Sx1 and Sx2 and the inductor Ls are in the open state.

As illustrated in FIG. 10B, the filter F13 has attenuation poles at the frequencies $f_{a1}$ and $f_{a2}$. Due to the generation of the open state around the direct current point, the suppression in the low-frequency area is improved. However, the resonance point generated at the frequency $f_{r3}$ locally maximizes the amount of attenuation at the frequency $f_{r3}$. Thus, the ladder filter such as the filter F13 may not have sufficient suppression in the low-frequency area.

Figure 11A:
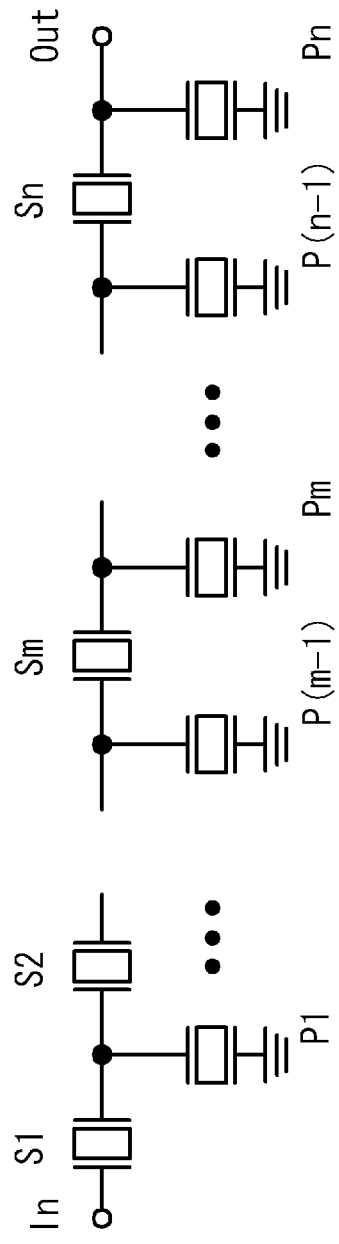
FIG. 11A is a circuit diagram of the filter F11.
Figure 11B:
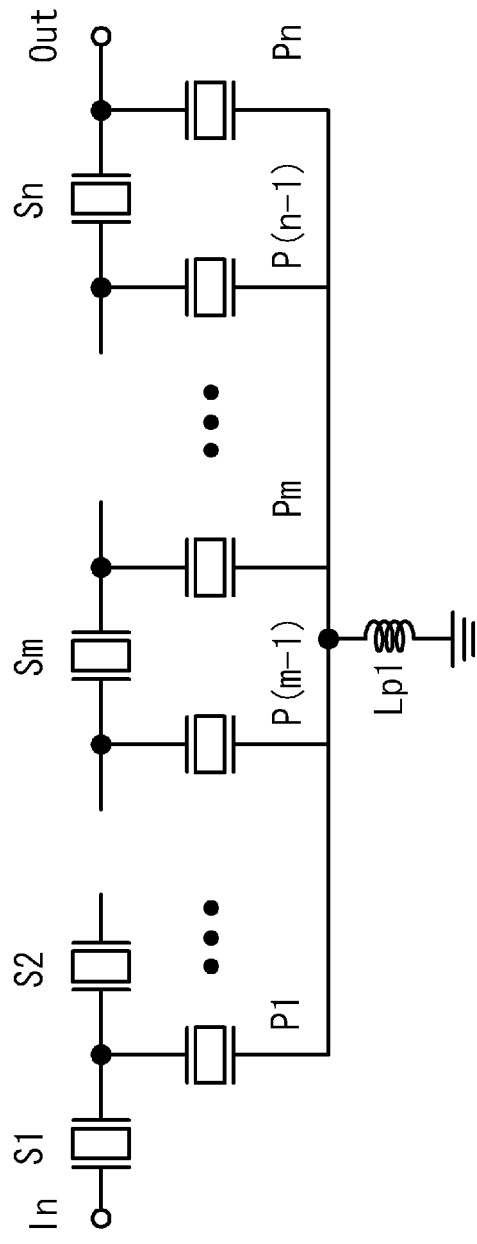
FIG. 11B is a circuit diagram of a filter F14.

A description is now given of an exemplary configuration in which an inductor is connected in series to parallel resonators of a ladder filter. FIG. 11A is a circuit diagram of the filter F11, and FIG. 11B is a circuit diagram of an exemplary configuration of a filter F14. A description of the structures that are the same as those illustrated in FIGS. 6A and 6B is omitted here.

As depicted in FIG. 11B, the filter F14 is a ladder filter in which an inductor Lp1 is connected to parallel resonators P1~Pn. Specifically, one end of the inductor Lp1 is connected to one ends of the parallel resonators P1~Pn, and the other end thereof is grounded. The inductor Lp1 is connected in series between the parallel resonators P1~Pn and the ground terminal. Next, a description is given of a characteristic of the filter F14.

Figure 12A:
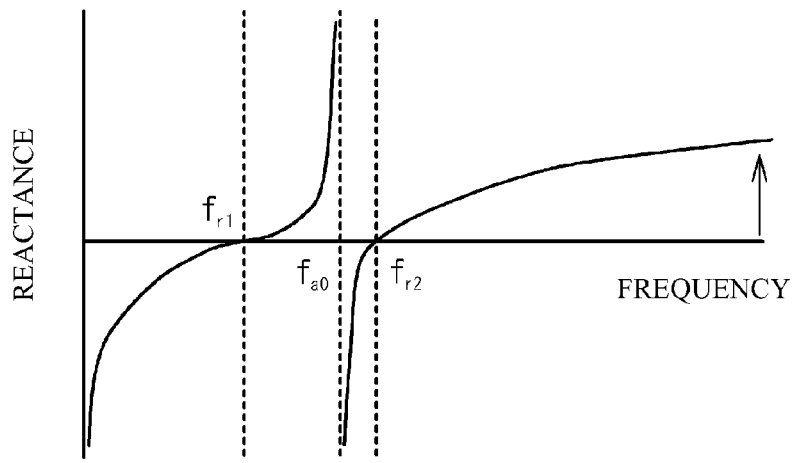
FIG. 12A is a diagram of a schematic reactance characteristic of a resonator and an inductor.
Figure 12B:
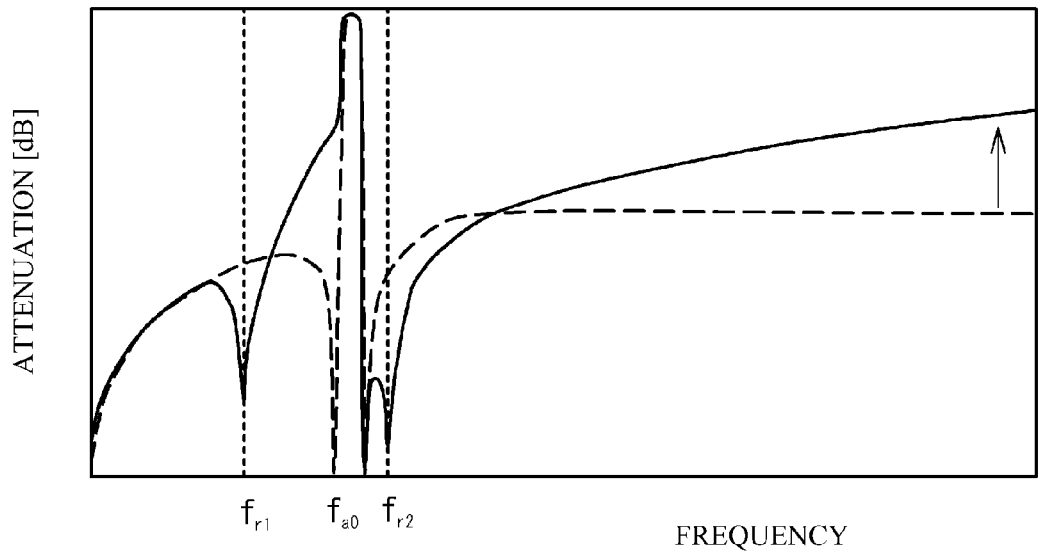
FIG. 12B is a diagram of an attenuation characteristic of the filter F14.

FIG. 12A is a diagram of a schematic reactance characteristic of a resonator and an inductor. FIG. 12B is a diagram of an exemplary attenuation characteristic of the filter F14. The scale of the horizontal axis of FIG. 12B that matches that of FIG. 12A is designed to match the scale of FIG. 5D. A solid line in FIG. 12B is the attenuation characteristic of the filter F14, and a broken line is the attenuation characteristic of the filter F11.

As illustrated in FIG. 12A, the resonance point shifts from the frequency $f_{ro}$ illustrated in FIG. 5C to the frequency $f_{r1}$. As illustrated in FIG. 12B, due to the shift of the resonance point, the low-frequency end of the pass band of the filter F14 shifts to the frequency $f_{r1}$. As illustrated in FIG. 12A, a new resonance point is generated at the frequency $f_{r2}$. As illustrated in FIG. 12B, the generation of the new resonance point results in a new attenuation pole at the frequency $f_{r2}$. As indicated by an arrow in FIG. 12A, the open state is generated in the high-frequency area. As indicated by an arrow in FIG. 12B, due to the generation of the open state, the suppression of the filter F14 deteriorates in the high-frequency area.

Figure 13A:
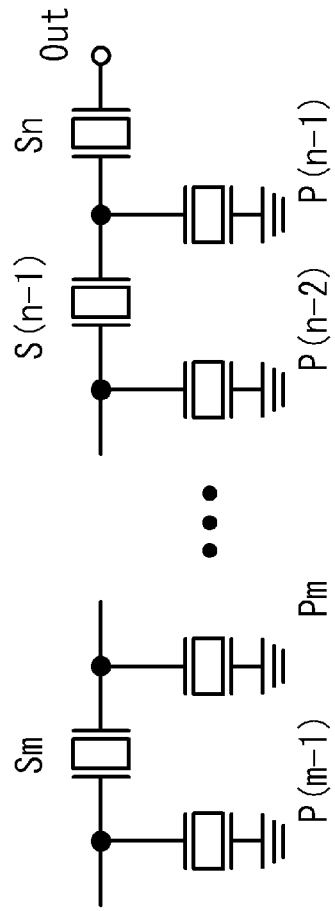
FIG. 13A is a circuit diagram of a filter F11a, and FIG. 13B is a circuit diagram of a filter F15.

In order to improve the suppression in the high-frequency area, another inductor may be added to a parallel arm. FIG. 13A is a circuit diagram of a filter F11a, and FIG. 13B is a circuit diagram of a filter F15.

As illustrated in FIG. 13A, the filter F11a includes series resonators S1~Sn and parallel resonators P1~P(n-1). The filter F11a is a ladder filter obtained by removing the parallel resonator Pn from the filter F11.

Figure 13B:
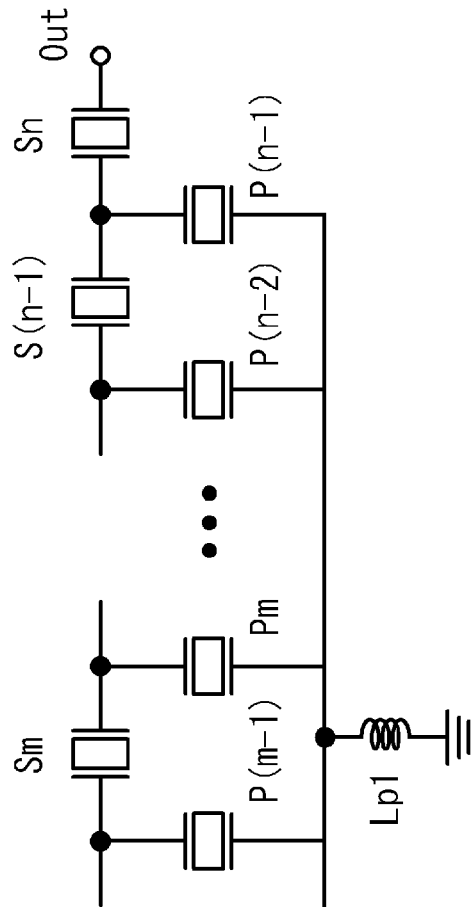

As illustrated in FIG. 13B, the filter F15 includes series resonators S1~Sn, parallel resonators P1~P(n-1) and inductors Lp1 and Lp2. One end of the inductor Lp2 is connected to the other end of the parallel resonator P1 in series. The other end of the inductor Lp2 is connected to one end of the inductor Lp1 in series, and is connected in parallel with the other ends of the parallel resonators P2~P(n-1). As described above, the filter F15 has an additional arrangement having the resonator in FIG. 5B to which the inductor is connected in series, as compared with the filter F14. Next, a characteristic of the filter F15 is described.

Figure 14A:
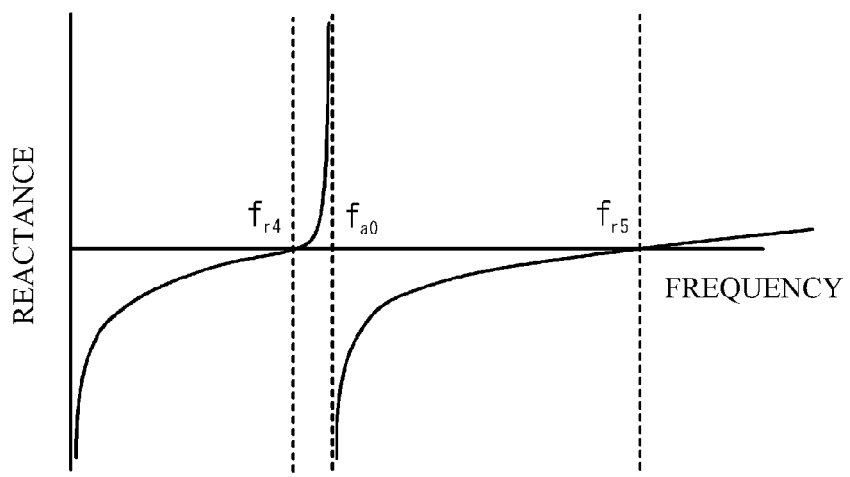
FIG. 14A is a diagram of a schematic reactance characteristic of a resonator and an inductor.
Figure 14B:
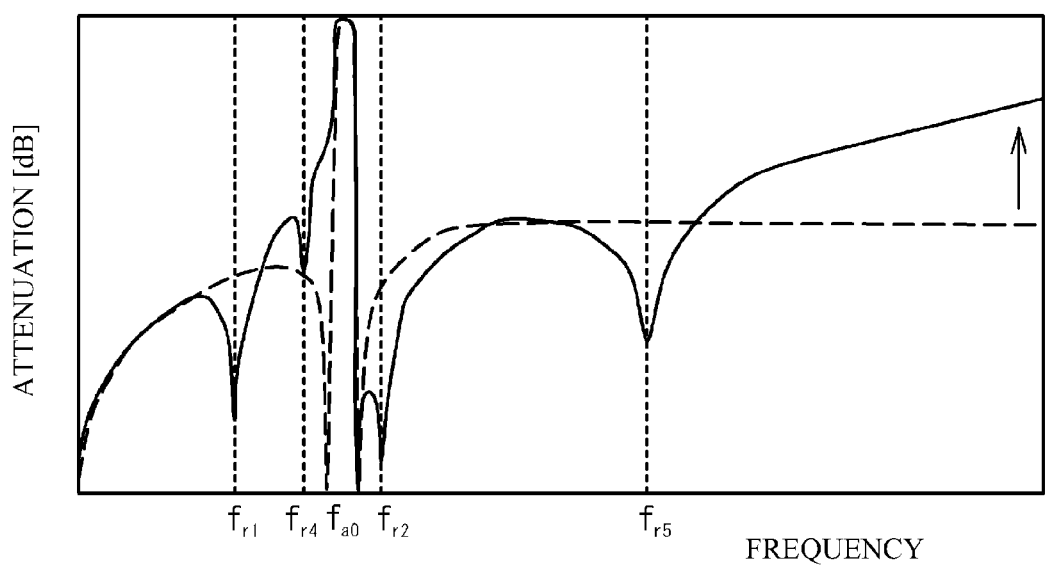
FIG. 14B is an attenuation characteristic of the filter F15.

FIG. 14A is a diagram of a schematic reactance characteristic of the parallel resonator P1 and the inductor Lp2. FIG. 14B is a diagram of an exemplary attenuation characteristic of the filter F15. A solid line in FIG. 14B is the attenuation characteristic of the filter F15, and a broken line is the attenuation characteristic of the filter F11. In the filter F15, the reactance characteristic in FIG. 12A and that in FIG. 14A are superimposed on each other and have influence.

As illustrated in FIG. 14A, the resonance point shifts from the frequency $f_{ro}$ in FIG. 5C to a frequency $f_{r4}$. As illustrated in FIG. 12B, the shift of the resonance point results in an attenuation pole at the frequency $f_{r4}$. As illustrated in FIG. 14A, a new resonance point is generated at a frequency $f_{r5}$. As illustrated in FIG. 14B, the generation of the new resonance point results in a new attenuation pole at the frequency $f_{r5}$. The frequency $f_{r4}$ is higher than the frequency $f_{r1}$, and is lower than the frequency $f_{ao}$. The frequency $f_{r5}$ is higher than the frequency $f_{r2}$. According to the filter F15, it is possible to locally realize high suppression around the attenuation pole at the frequency $f_{r5}$ even in the high-frequency area. However, as indicated by the arrow in FIG. 14B, the suppression deteriorates greatly in the high-frequency area higher than the frequency $f_{r5}$.

The filter F12~F15 have the additional inductors to generate the attenuation poles in the ladder filters. However, as indicated in FIGS. 7B and 10B, the filters F12 and F13 have deterioration of the suppression in the low-frequency area. Further, as indicated in FIGS. 12B and 14B, the filters F14 and F15 have deterioration of the suppression in the high-frequency area. That is, it is difficult to realize high suppression over broad areas.

Now, a description is given of an exemplary configuration in which the inductance value is varied. FIG. 15A is a circuit diagram of a filter F16a, and FIG. 15B is a circuit diagram of a filter F16.

Referring to FIG. 15A, the filter F16a includes series resonators S1~S6 and parallel resonators P1~P6. The series resonators S1~S6 are connected in series between the input terminal In and the output terminal Out. One of the series resonator S1 is connected to the input terminal In. The other end of the series resonator S1 is connected to one end of the series resonator S2. The other end of the series resonator S2 is connected to one of the series resonator S3. The other end of the series resonator S3 is connected to the output terminal Out in series. One end of the parallel resonator P1 is connected to a node between the input terminal In and the series resonator S1. One end of the parallel resonator P2 is connected to a node between the series resonators S1 and S2. One end of the parallel resonator P3 is connected to a node between the series resonators S2 and S3. One end of the parallel resonator P4 is connected to a node between the series resonator S3 and the output terminal Out. The other terminals of the parallel resonators P1~P4 are grounded.

Referring to FIG. 15B, the filter F16 is a ladder filter configured by inserting a series resonator Sx and an inductor Ls between the input terminal In and the series resonator S1 in the filter F16a. The series resonator Sx and the inductor Ls are connected in parallel with each other. The inductor Ls may be connected in parallel with any of the other series resonators.

Next, a description is given of an attenuation characteristic of the filter F16. A case is described where the attenuation characteristic of the filter F16 is calculated by changing the inductance value of the inductor Ls illustrated in FIG. 15B. The conditions used for the calculation are as follows. Each resonator is a surface acoustic wave resonator and has an impedance of 50Ω. A ratio Cp/Cs of the capacitance Cp of one parallel resonator to the capacitance Cs of one series resonator is 0.6. The product of the capacitances Cp and Cs is 73.5% of $1/(\omega_o \cdot R)^2$ where $\omega_o$ is the center frequency of the filter F16, and R is the matching impedance. R is 50Ω, for example.

Figure 16A:
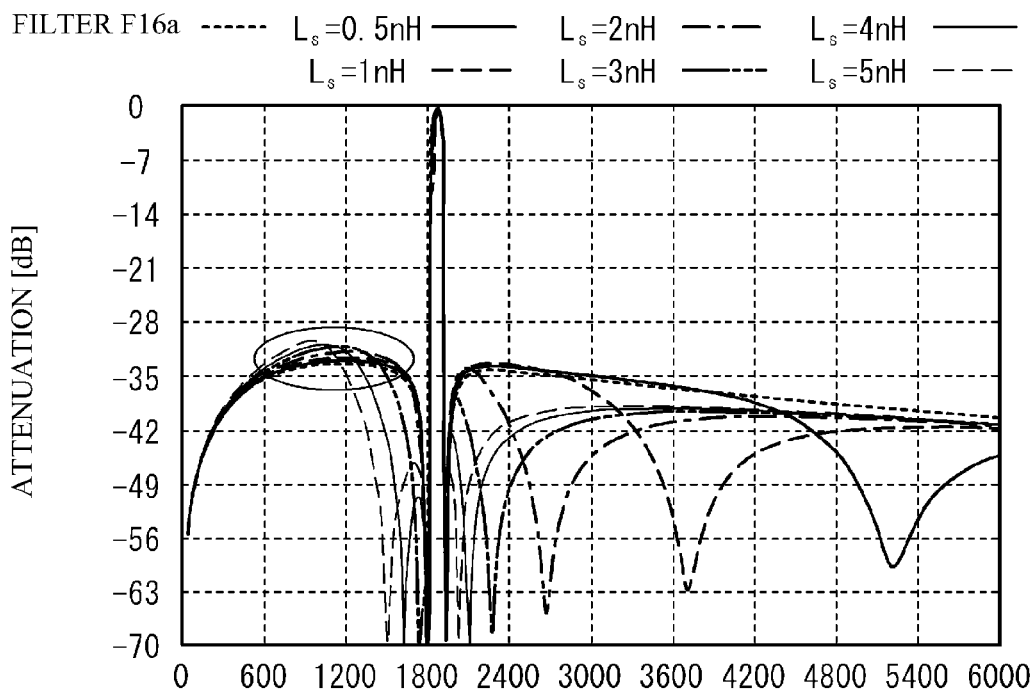
FIG. 16A is a diagram of an attenuation characteristic of the filter F16.
Figure 16B:
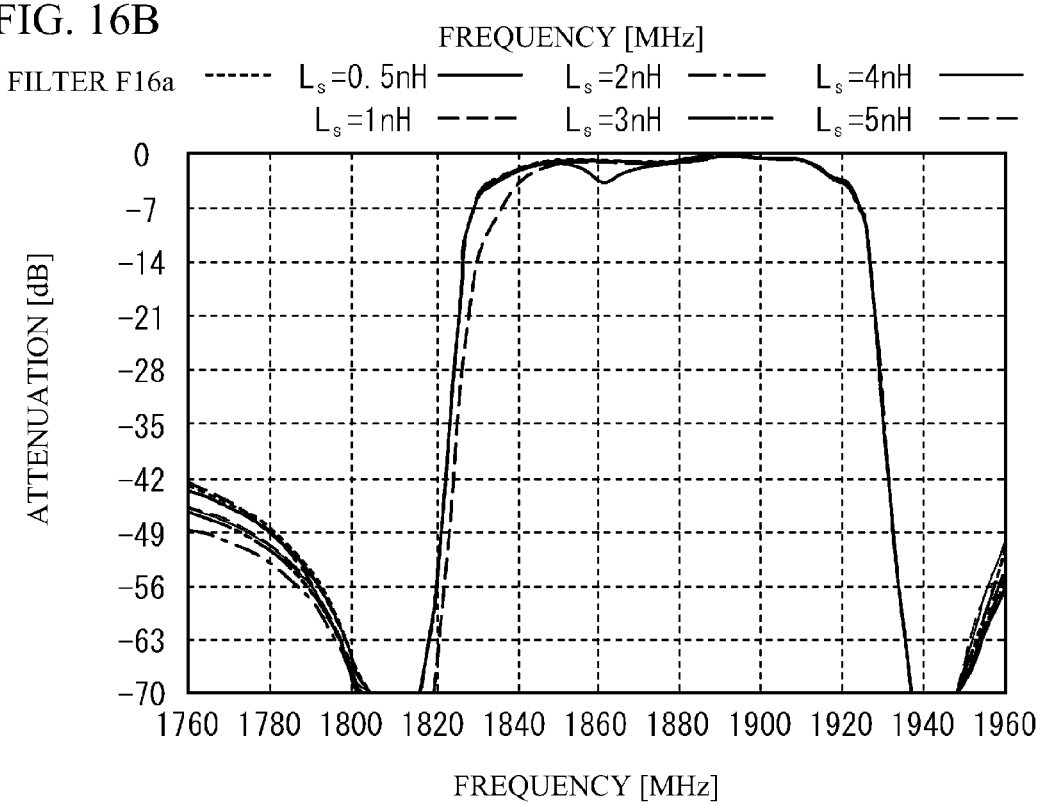
FIG. 16B is an enlarged view of a pass band illustrated in FIG. 16A.

FIG. 16A is a diagram of an attenuation characteristic of the filter F16. FIG. 16B is an enlarged view of a pass band in FIG. 16A. The inductance values of the inductor Ls in FIGS. 15A and 15B are 0.5 nH, 1 nH, 2 nH, 3 nH, 4 nH and 5 nH. A thick dotted line is an attenuation characteristic of the filter F16a. A thick solid line is an attenuation characteristic for Ls of 0.5 nH. A thick broken line is an attenuation characteristic for Ls of 1 nH. A one-dotted chain line is an attenuation characteristic for Ls of 2 nH. A two-dotted chain line is an attenuation characteristic for Ls of 3 nH. A thin solid line is an attenuation characteristic for Ls of 4 nH. A thin broken line is an attenuation characteristic for Ls of 5 nH.

As illustrated in FIGS. 16A and 16B, the attenuation characteristics for the different inductance values overlap with each other in the pass band. As illustrated in FIG. 16A, the filter F16 with the inductor Ls has attenuation poles at the low-frequency and high-frequency sides of the pass band. It is assumed that the attenuation pole at the low-frequency side is a first attenuation pole and that at the high-frequency side is a second attenuation pole. As the inductance value of the inductor Ls is smaller, the first attenuation pole shifts to a higher frequency. For example, for Ls of 5 nH, the first attenuation pole is generated at around 1500 MHz. In contrast, for Ls of 0.5 nH, the first attenuation pole is generated at around 1860 MHz in the pass band.

For Ls of 5 nH, the suppression deteriorates at frequencies of 600~1200 MHz. This deterioration of suppression corresponds to deterioration of suppression around the direct current point in FIG. 7B. In contrast, as illustrated by an ellipse in FIG. 16A, due to the shift of the first attenuation pole to the high-frequency side, the suppression in the low-frequency area is improved. For Ls of 0.5 nH, high suppression is obtained around 1200 MHz so that the amount of attenuation is almost even.

As the inductance value of the inductor Ls is made smaller, the second attenuation pole shifts to a higher frequency. For example, for Ls of 2 nH, the second attenuation pole is generated at around 2700 MHz. For Ls of 1 nH, the second attenuation pole is generated at a frequency over 3600 MHz. For Ls of 0.5 nH, the second attenuation pole is generated at a frequency over 5000 MHz. In the filter F16, deterioration of suppression in the high-frequency area over the second attenuation pole is not observed. The filter F16a without the inductor Ls does not have the second attenuation pole.

Like the filter F16, the attenuation characteristics is changed by connecting the inductor in parallel with the series resonator and changing the inductance value of the inductor. Like the example for Ls of 0.5 nH, when the inductance value is small, the first attenuation pole is generated at a frequency higher than the high-frequency end of the pass band. As illustrated in FIG. 2B, the low-frequency end of the pass band of the ladder filter is defined by the resonance frequency of the parallel resonator. That is, by using a small inductance value of the inductor Ls, the first attenuation pole can be generated at a frequency equal to or higher than one of the parallel resonators P1~P4 of the filter F16 that has the highest frequency. Thus, as illustrated in FIG. 16A, the suppression in the low-frequency area can be improved. The second attenuation pole is generated in the high-frequency area, and the suppression does not deteriorate. Particularly, by using a small inductance value, the second attenuation pole can be generated at a higher frequency.

First Embodiment

Figure 17:
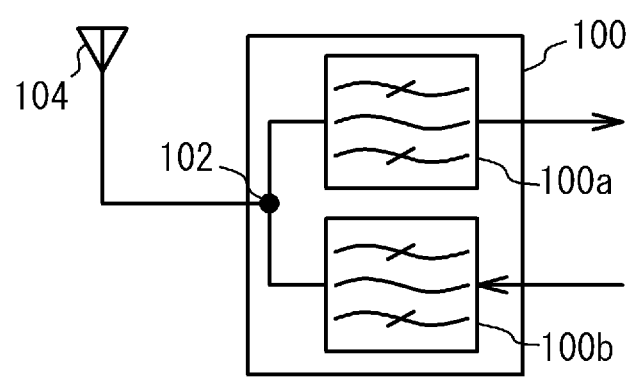
FIG. 17 is a block diagram of a duplexer in accordance with a first embodiment.

A description is now given of a first embodiment based on the above-described considerations. FIG. 17 is a block diagram of a duplexer in accordance with the first embodiment.

Referring to FIG. 17, a duplexer 100 includes a reception filter 100a and a transmission filter 100b. The reception filter 100a and the transmission filter 100b are connected to a common terminal (antenna terminal) 102. The common terminal 102 is connected to an antenna 104. The reception filter 100a receives a signal from the antenna 104, and outputs the amplified reception signal to a next-stage circuit such as an amplifier. The transmission filter 100b outputs a signal from a previous-stage circuit such as an amplifier to the antenna 104, via which the transmission signal from the transmission filter 100b is transmitted. The reception filter 100a suppresses the transmission signal from flowing to the reception terminal. The transmission filter 100b suppresses the appearance of the reception signal at the transmission terminal. The duplexer 100 conforms to, for example, a W-CDMA (Wideband Code Division Multiple Access) Band 2 system.

The detailed structure of the duplexer 100 is now described with reference FIG. 18, which is a circuit diagram of the duplexer 100 in accordance with the first embodiment.

Figure 18:
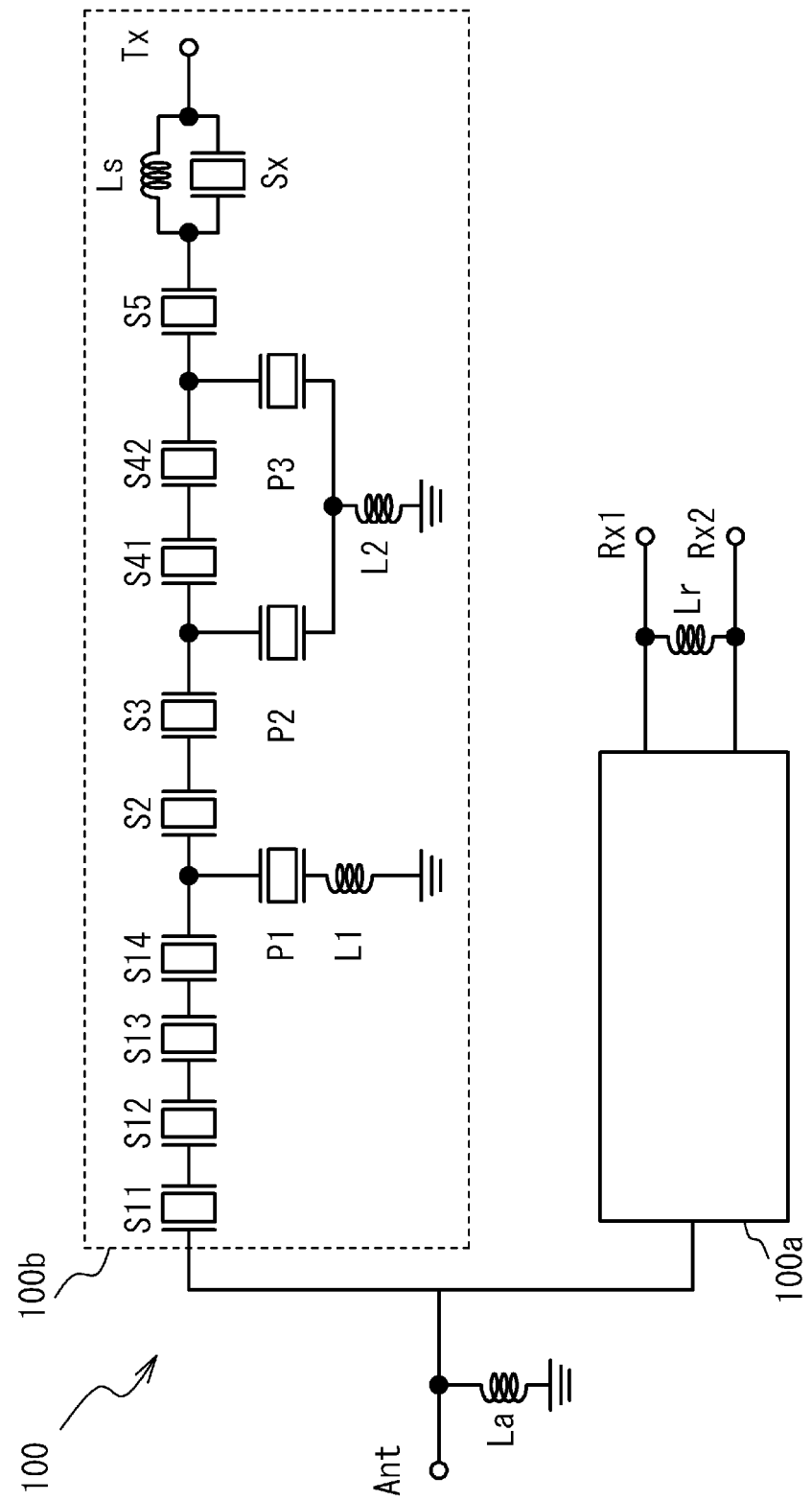
FIG. 18 is a circuit diagram of the duplexer in accordance with the first embodiment.

Referring to FIG. 18, the duplexer 100 includes the reception filter 100a, the transmission filter 100b, inductors La and Lr, an antenna terminal Ant, reception terminals Rx1 and Rx2, and a transmission terminal Tx. One end of the reception filter 100a, one end of the transmission filter 100b and the antenna terminal Ant are connected together. One end of the inductor La is connected to the antenna terminal Ant, and the other end thereof is grounded. The other end of the reception filter 100a is connected to the reception terminals Rx1 and Rx2. The inductor Lr is connected between the reception terminals Rx1 and Rx2. A description of the circuit configuration of the reception filter 100a is omitted here.

The transmission filter 100b includes series resonators S11~S5 and Sx, parallel resonators P1~P3, and inductors Ls, L1 and L2. The series resonators S11~Sx are connected between the antenna terminal Ant and the transmission terminal Tx. The antenna terminal Ant corresponds to an output terminal of the transmission filter 100b, and the transmission terminal Tx corresponds to an input terminal of the transmission filter 100b. One end of the series resonator S11 is connected to the antenna terminal Ant and the reception filter 100a. One end of the series resonator Sx is connected to the transmission terminal Tx. The inductor Ls (first inductor) is connected to the series resonator Sx. One end of the parallel resonator P1 is connected to a node between the series resonators S14 and S2, and the other end thereof is connected to one end of the inductor L1 (second inductor). The other end of the inductor L1 is grounded. The inductor L1 is connected in series between the parallel resonator P1 and the ground terminal. One end of the parallel resonator P2 is connected to a node between the series resonators S3 and S4. One end of the parallel resonator P3 is connected to a node between the series resonators S42 and S5. The other end of the parallel resonator P2 and that of the parallel resonator P3 are connected to one end of the inductor L2 (second inductor). The other end of the inductor L2 is grounded. The inductor L2 is connected in series between the parallel resonators P2 and P3 and the ground terminal. The transmission filter 100b is a ladder filter in accordance with the first embodiment.

Figure 19A:
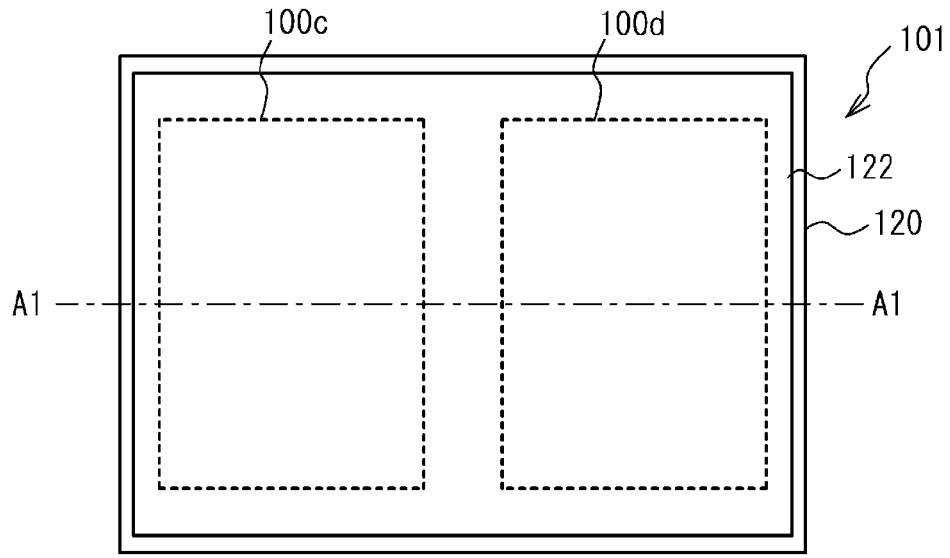
FIG. 19A is a plan view of a duplexer chip in accordance with the first embodiment.
Figure 19B:
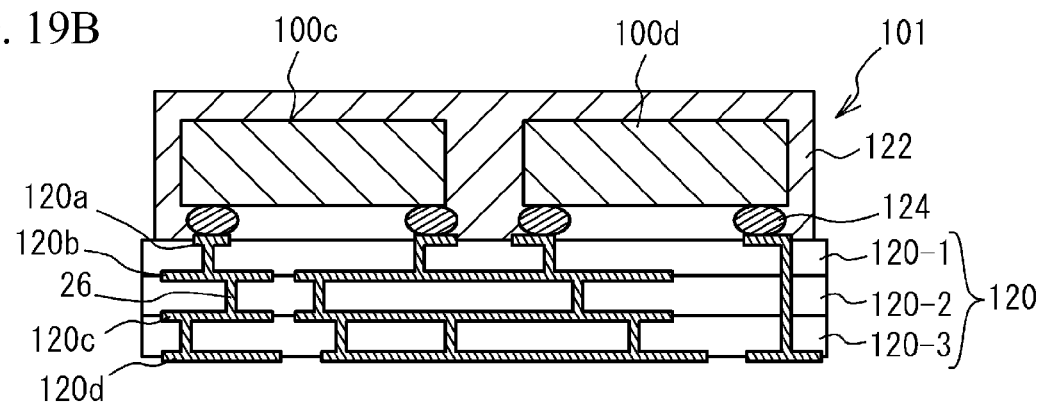
FIG. 19B is a cross-sectional view taken along a line A1-A1 in FIG. 19A.
Figure 19C:
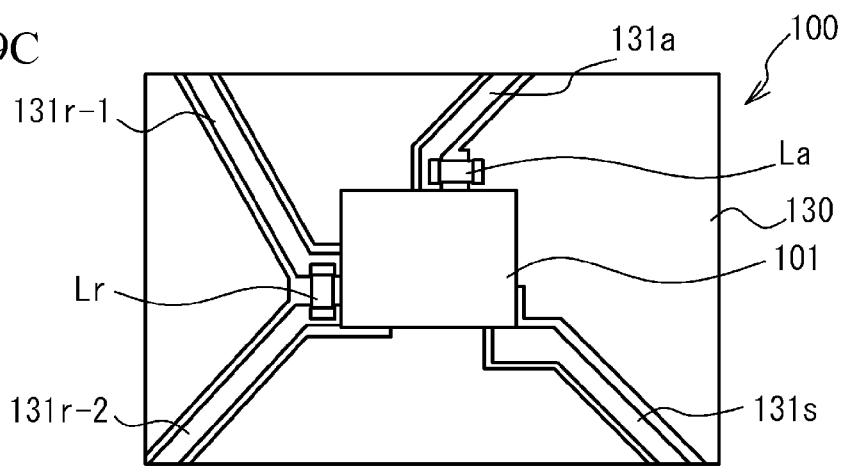
FIG. 19C is a plan view of the duplexer in accordance with the first embodiment.

The detailed structure of the duplexer 100 is now described. FIG. 19A is a plan view of a duplexer chip in accordance with the first embodiment, and FIG. 19B is a cross-sectional view taken along a line A1-A1 in FIG. 19A. FIG. 19C is a plan view of the duplexer 100 in accordance with the first embodiment.

As illustrated in FIGS. 19A and 19B, a duplexer chip 101 includes a reception filter chip 100c, a transmission filter chip 100d, a package substrate 120 and a seal member 122. The view of FIG. 19A is seen through the seal member 122. As illustrated in FIG. 19B, the reception filter chip 100c and the transmission filter chip 100d are flip-chip mounted on the package substrate 120 by bumps 124. The package substrate 120 has a three-layer structure composed of a first layer 120-1, a second layer 120-2 below the first layer 120-1, and a third layer below the second layer 120-2. Interconnection layers 120a, 120b, 120c and 120d are formed on the upper, intermediate and lower surfaces of the package substrate 120, and are mutually connected by via interconnections 26. The interconnection layer 120b is located between the first layer 120-1 and the second layer 120-2. The interconnection layer 120c is located between the second layer 120-2 and the third layer 120-3. The interconnection layer 120d is located on the lower surface of the third layer 120-3, and functions as footpads. Some of the interconnection lines and some of the via interconnections 26 provided on or in the package substrate 120 function as inductors. The seal member 122 is made of an insulator such as epoxy resin or solder, and seals the reception filter chip 100c and the transmission filter chip 100d. The package substrate 120 is made of an insulator such as ceramic. The interconnection layers 120a~120d are made of a metal such as aluminum. The bumps 124 are made of a metal such as gold (Au).

As illustrated in FIG. 19C, the duplexer chip 101 is flip-chip mounted on a printed-circuit board 130 via the interconnection layer 120c. Inductors Lr and La that are chip inductors are mounted on the printed-circuit board 130. The duplexer 100 is structured as described above. Although not illustrated, the antenna terminal Ant, the reception terminals Rx1 and Rx2 and the transmission terminal Tx are provided on the printed-circuit board 130. The duplexer chip 101 and the inductor Lr are connected together by interconnection lines 131r-1 and 131r-2. The interconnection line 131r-1 is connected to the reception terminal Rx1. The interconnection line 131r-2 is connected to the reception terminal Rx2. The duplexer chip 101 and the inductor La are connected together via an interconnection line 131a. The interconnection line 131a is connected to the antenna terminal Ant. An interconnection line 131s is connected to the transmission terminal Tx.

Figure 20:
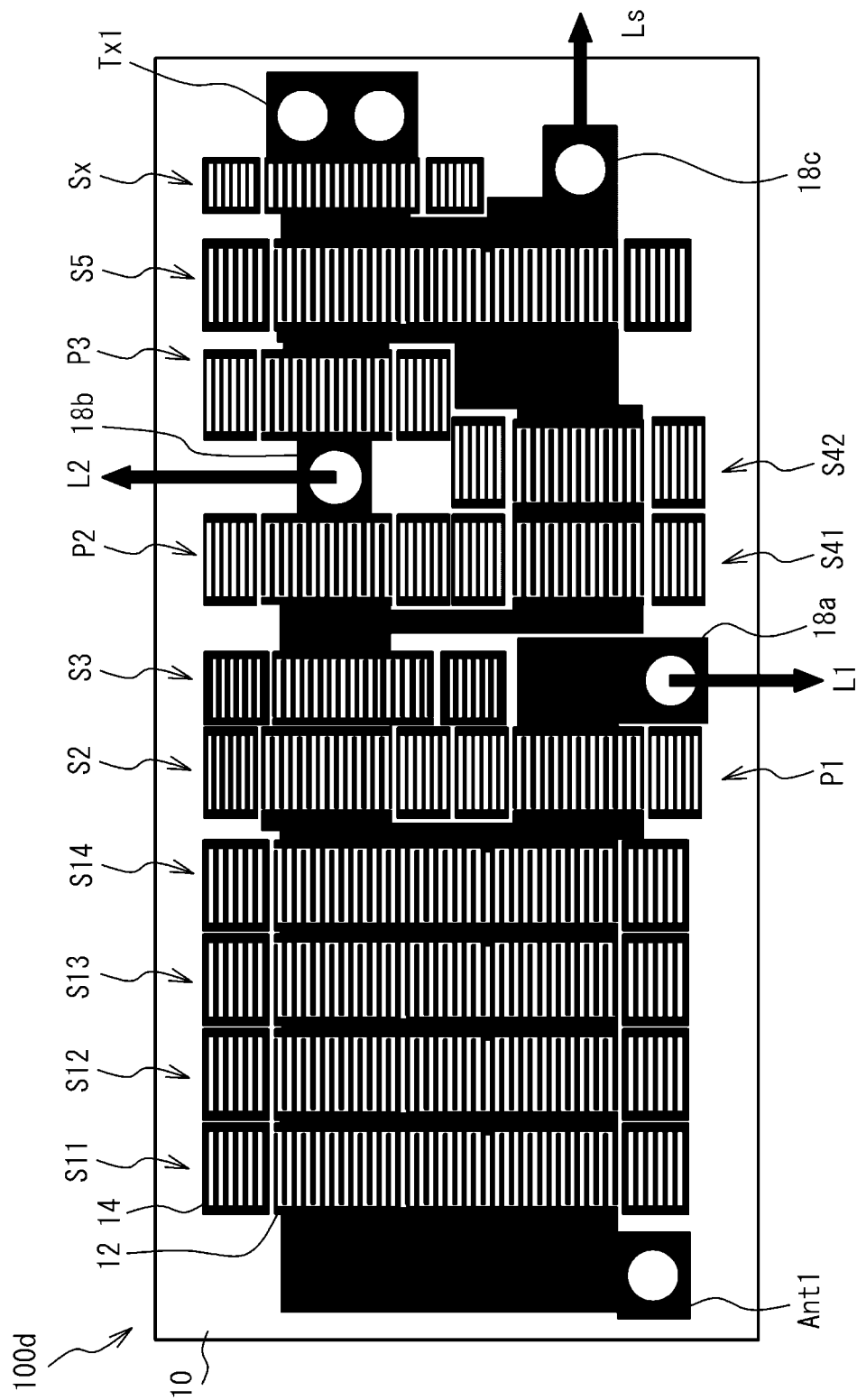
FIG. 20 is a transparent diagram of a transmission filter chip included in the duplexer in accordance with the first embodiment.

The structures of the filters of the duplexer are described. FIG. 20 is a transparent view of the transmission filter chip 100d of the duplexer 100 in accordance with the first embodiment.

As illustrated in FIG. 20, the transmission filter chip 100d includes a piezoelectric substrate 10, the series resonators S1~Sx, the parallel resonators P1~P3, an antenna terminal Ant1, a transmission terminal Tx1, and terminals 18a~18c. The series resonators S11~Sx and the parallel resonators P1~P3 are surface acoustic wave (SAW) resonators.

The structure of the SAW resonators is described by specifically referring to the series resonator S11. The series resonator S11 is configured to arrange a pair of comb-like electrodes 12 on the piezoelectric substrate 10 and reflectors positioned at both sides of the comb-like electrodes 12. The comb-like electrodes 12 excite acoustic waves having a frequency that depends on the pitch between the adjacent electrode fingers of the comb-like electrodes 12. The reflectors 14 reflect the acoustic waves propagated from the comb-like electrodes 12. The series resonators S12~Sx and the parallel resonators P1~P3 are configured similarly.

The transmission filter chip 100d is flip-chip mounted so that the surface on which the resonators are provided and the upper surface of the package substrate 120 face each other. As illustrated in FIG. 13B, there is a spacing between the transmission filter chip 100d and the package substrate 120. Thus, the excitation of acoustic waves by each resonator is not disturbed. The piezoelectric substrate 10 is made of a dielectric substance such as lithium tantalate (LiTaO$_3$) or lithium niobate (LiNbO$_3$). The comb-like electrodes, the resonators an the terminals may be made of a metal such as aluminum (Al).

One of the pair of comb-like electrodes 12 of the series resonator S11 is connected to the antenna terminal Ant1, which is connected to the antenna 104 illustrated in FIG. 17. One of the pair of comb-like electrodes of the parallel resonator P1 is connected to the terminal 18a, which is connected to the inductor L1 illustrated in FIG. 18. One of the comb-like electrodes 12 of the parallel resonator P2 and one of that of the parallel resonator P3 are connected to the terminal 18b. The terminal 18b is connected to the inductor L2 in FIG. 18. One of the comb-like electrodes 12 that form the series resonator S5 and that of the Sx are connected to the terminal 18c, which is connected to the inductor Ls illustrated in FIG. 18. One of the pair of comb-like electrodes that form the series resonator Sx is connected to the transmission terminal Tx1, which is connected to the transmission terminal Tx illustrated in FIG. 18. Each terminal is used for flip-chip mounting on the package substrate 120 illustrated in FIG. 19. Circular shapes on the solid patterns are areas in which the bumps 124 are connected.

Figure 21A:
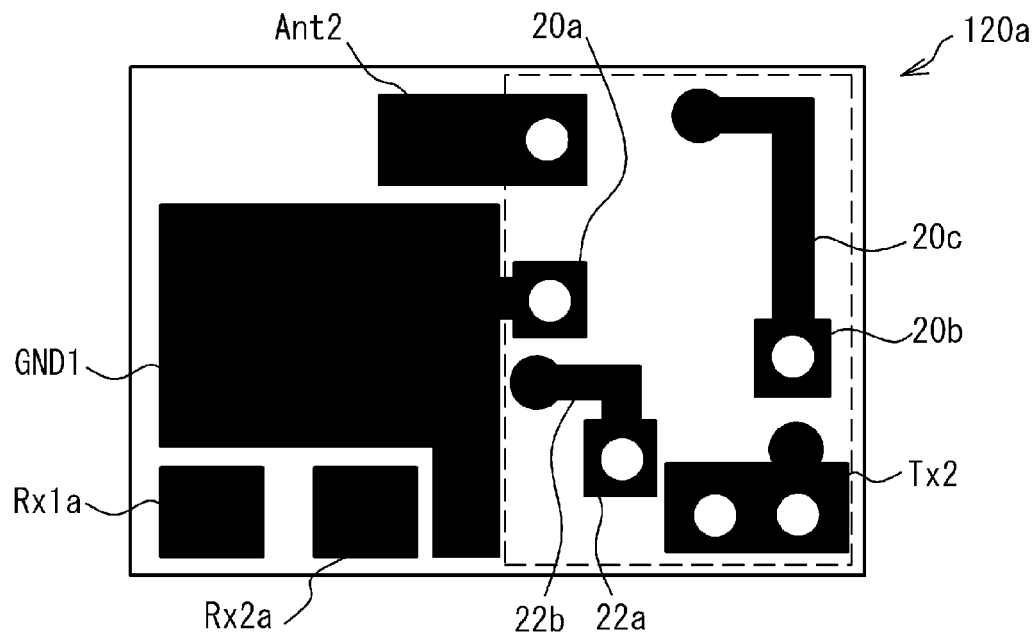
FIGS. 21A and 21B are plan views of a package substrate.
Figure 21B:
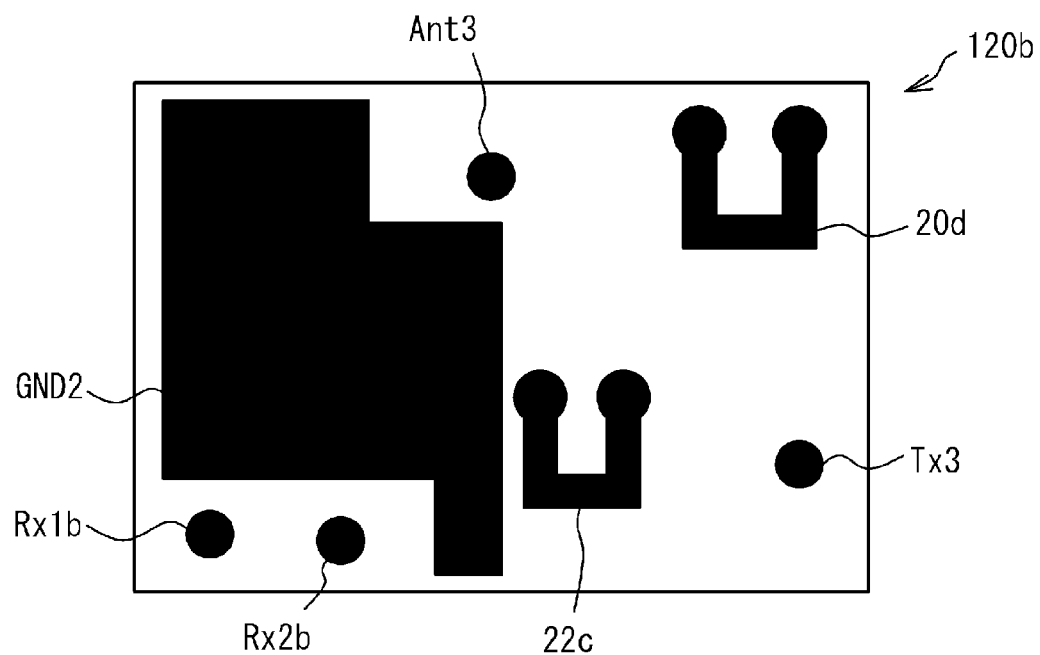
Figure 22A:
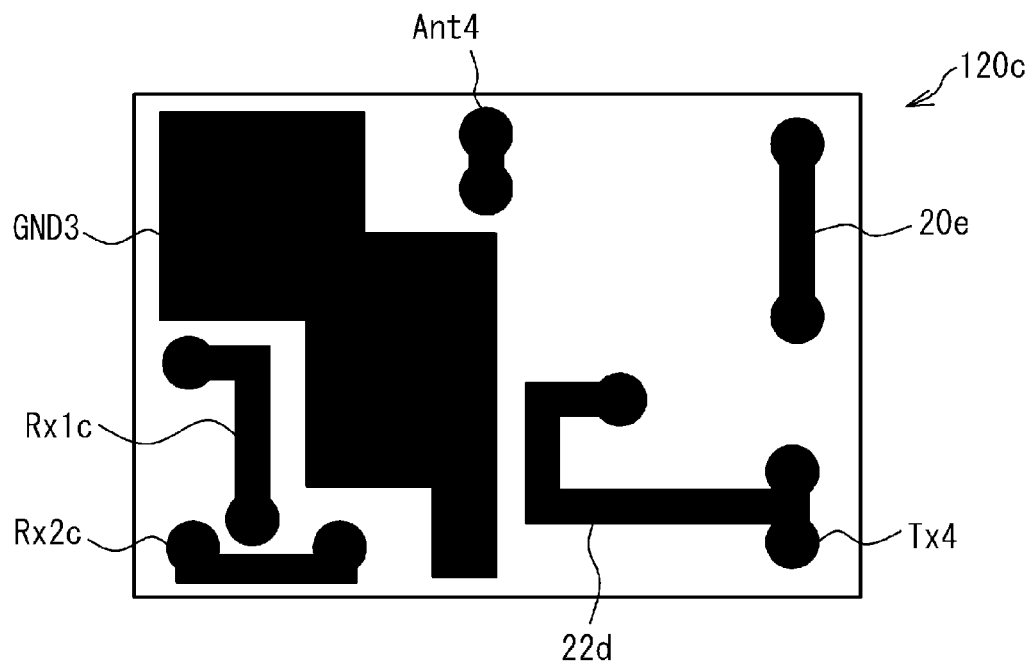
FIGS. 22A and 22B are plan views of the package substrate.
Figure 22B:
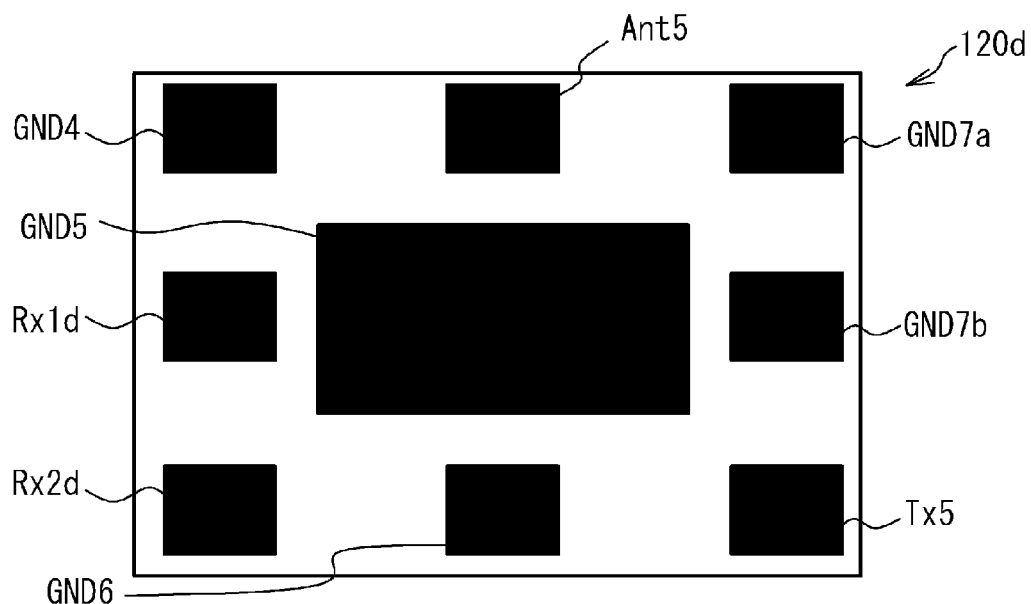

The package substrate 120 is now described. FIGS. 21A, 21B, 22A and 22B are plan views of the package substrate 120. More specifically, FIG. 21A is a plan view of the upper surface of the package substrate 120. FIG. 21B is a plan view of the upper surface of the second layer 120-2 seen through the first layer 120-1. FIG. 22A is a plan view of the upper surface of the third layer 120-3 seen through the first layer 120-1 and the second layer 120-2. FIG. 22B is a plan view of the package substrate 120 seen through the first layer 120-1 through 120-3.

As illustrated in FIG. 21A, the interconnection layer 120a is provided on the upper surface of the first layer 120-1. The interconnection layer 120a includes an antenna terminal Ant2, a transmission terminal Tx2, reception terminals Rx1a and Rx2a, a ground terminal GND1, terminals 20a, 20b and 22a, and interconnection lines 20c and 22d. An area surrounded by a broken line in FIG. 21A is used to mount the transmission filter chip 100d. The antenna terminal Ant2 of the interconnection layer 120a is connected to the antenna terminal Ant1 of the transmission filter chip 100d. The transmission terminal Tx2 of the interconnection layer 120a is connected to the transmission terminal Tx1 of the transmission filter chip 100d. The terminal 20a of the interconnection layer 120a is connected to the terminal 18a of the transmission filter chip 100d. The terminal 20b of the interconnection layer 120a is connected to the terminal 18b of the transmission filter chip 100d. The terminal 22a of the interconnection layer 120a is connected to the terminal 18c of the transmission filter chip 100d. The terminal 20a is connected to the ground terminal GND1. The terminal 20b is connected to the via interconnection 26 via an interconnection line 20c. The terminal 22a is connected to the via interconnection 26 via the interconnection 22b.

As illustrated in FIG. 21B, the interconnection layer 120b is provided on the upper surface of the second layer 120-2. The interconnection layer 120b includes an antenna pattern Ant3, a transmission pattern Tx3, reception patterns Rx1b and Rx2b, a ground pattern GND2 and interconnection lines 20d and 22c. As has been described with reference to FIG. 19B, the interconnection layers 120a and 120b are connected together by the via interconnection 26. Specifically, the antenna pattern Ant3 of the interconnection layer 120b is connected to the antenna terminal Ant2 of the interconnection layer 120a. The transmission pattern Tx3 of the interconnection layer 120b is connected to the transmission terminal Tx2 of the interconnection layer 120a. The reception pattern Rx1b of the interconnection layer 120b is connected to the reception terminal Rx1a of the interconnection layer 120a. The reception pattern Rx2b of the interconnection layer 120b is connected to the reception terminal Rx2a of the interconnection layer 120a. The interconnection line 20d of the interconnection layer 120b is connected to the interconnection line 20c of the interconnection layer 120a. The interconnection line 22c of the interconnection layer 120b is connected to the interconnection line 22b of the interconnection layer 120a.

As illustrated in FIG. 22A, the interconnection layer 120c is provided on the upper surface of the third layer 120-3. The interconnection layer 120c includes an antenna pattern Ant4, a transmission pattern Tx4, reception patterns Rx1c and Rx2c, a ground pattern GND3, and interconnection lines 20e and 22d. The interconnection layers 120b and 120c are connected together by the via interconnection 26. The antenna pattern Ant4 of the interconnection layer 120c is connected to the antenna pattern Ant3 of the interconnection layer 120b. The transmission pattern Tx4 of the interconnection layer 120c is connected to the transmission pattern Tx3 of the interconnection layer 120b. The reception pattern Rx1c of the interconnection layer 120c is connected to the reception pattern Rx1b of the interconnection layer 120b. The interconnection pattern Rx2c of the interconnection layer 120c is connected to the reception pattern Rx2b of the interconnection layer 120b. The ground pattern GND3 of the interconnection layer 120c is connected to the ground pattern GND2 of the interconnection layer 120b. The interconnection line 20e of the interconnection layer 120c is connected to the interconnection line 20d of the interconnection layer 120b. The interconnection line 22d of the interconnection layer 120c is connected to the interconnection line 22c of the interconnection layer 120b. The interconnection line 22d is connected to the transmission pattern Tx4.

The interconnection layer 120d is provided on the lower surface of the third layer 120-3. The interconnection layer 120d includes an antenna terminal Ant5, a transmission terminal Tx5, reception terminals Rx1d and Rx2d, ground terminals GND4, GND5, GND6, GND7a and GND7b. The interconnection layers 120d and 120c are connected together by the via interconnection 26. The antenna terminal Ant5 of the interconnection layer 120d is connected to the antenna pattern Ant4 of the interconnection layer 120c. The transmission terminal Tx5 of the interconnection layer 120d is connected to the transmission pattern Tx4 of the interconnection layer 120c. The reception terminal Rx1d of the interconnection layer 120d is connected to the reception pattern Rx1c of the interconnection layer 120c. The reception terminal Rx2d of the interconnection layer 120d is connected to the reception pattern Rx2c of the interconnection layer 120c. The ground terminals GND4, GND5 and GND6 of the interconnection layer 120d are connected to the ground pattern GND3 of the interconnection layer 120c. The ground terminals GND7a and GND7b of the interconnection layer 120d are connected to the interconnection line 20e of the interconnection layer 120c.

The terminal 20a contributes to forming the inductor L1. The interconnection lines 20c, 20d and 20e and the via interconnections 26 for making connections therewith contribute to forming the inductor L2. The interconnection lines 22b, 22c and 22d and the via interconnections 26 for making connection therewith contribute to forming the inductor Ls. By changing the lengths of the interconnection lines, the inductance values may be adjusted.

A description is given of an attenuation characteristic of the ladder filter in accordance with the first embodiment. The attenuation characteristics of the transmission filter 100b, a filter F17 of a first comparative example, and a resonance circuit C1 of a second comparative example. First, the first comparative example is described.

Figure 23A:
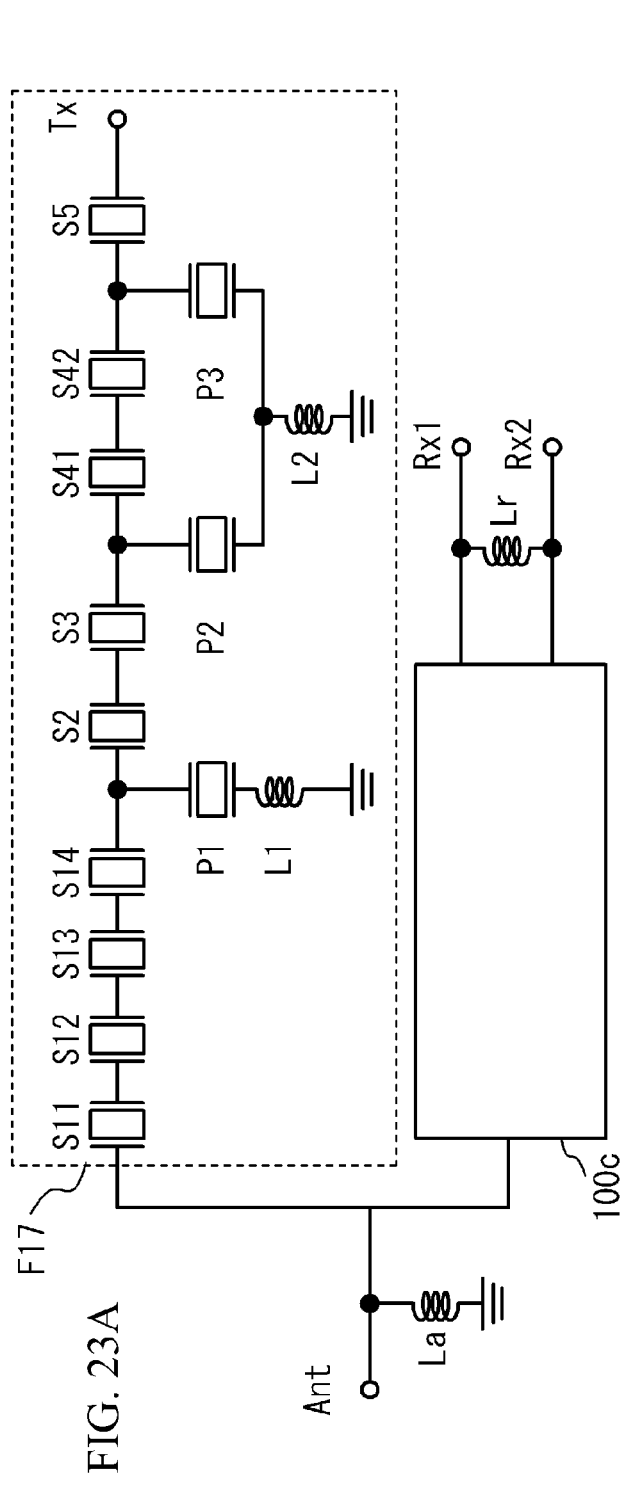
FIG. 23A is a circuit diagram of a filter in accordance with a first comparative example.
Figure 23B:
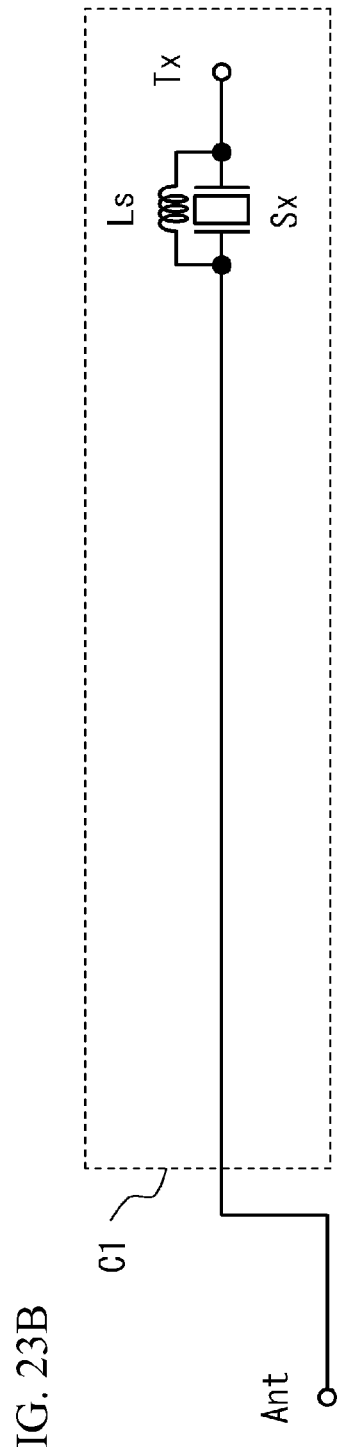
FIG. 23B is a circuit diagram of a resonance circuit in accordance with a second comparative example.

FIG. 23A is a circuit diagram of the filter F17 of the first comparative example, and FIG. 23B is a circuit diagram of the resonance circuit C1 of the second embodiment.

Referring to FIG. 23A, the filter F17 is configured by removing the series resonator Sx and the inductor Ls from the transmission filter 100b. The resonance circuit C1 of the second comparative example is a filter formed by the series resonator Sx and the inductor Ls. The resonance circuit C1 is the same as illustrated in FIG. 4B. The transmission filter 100b is a filter configured by connecting the resonance circuit C1 to the filter F17.

The resonance frequencies of the parallel resonators P1 provided in the transmission filter 100b and the filter F17 are 1815 MHz, and the resonance frequencies of the parallel resonator P2 provided therein are 1823 MHz, the resonance frequencies of the parallel resonators P3 provided therein being 1827 MHz. The anti-resonance frequencies of the series resonator Sx and the inductor Ls provided in the transmission filter 100b and the resonance circuit C1 are 1836 MHz and 2560 MHz, respectively. This corresponds to a case where, in FIG. 4D, $f_{a1}$=2560 MHz and $f_{a2}$=1836 MHz. The anti-resonance frequencies $f_{a1}$ and $f_{a2}$ are higher than 1827 MHz that is the resonance frequency of the parallel resonator P3 that is the highest among the parallel resonators P1~P3.

Figure 24A:
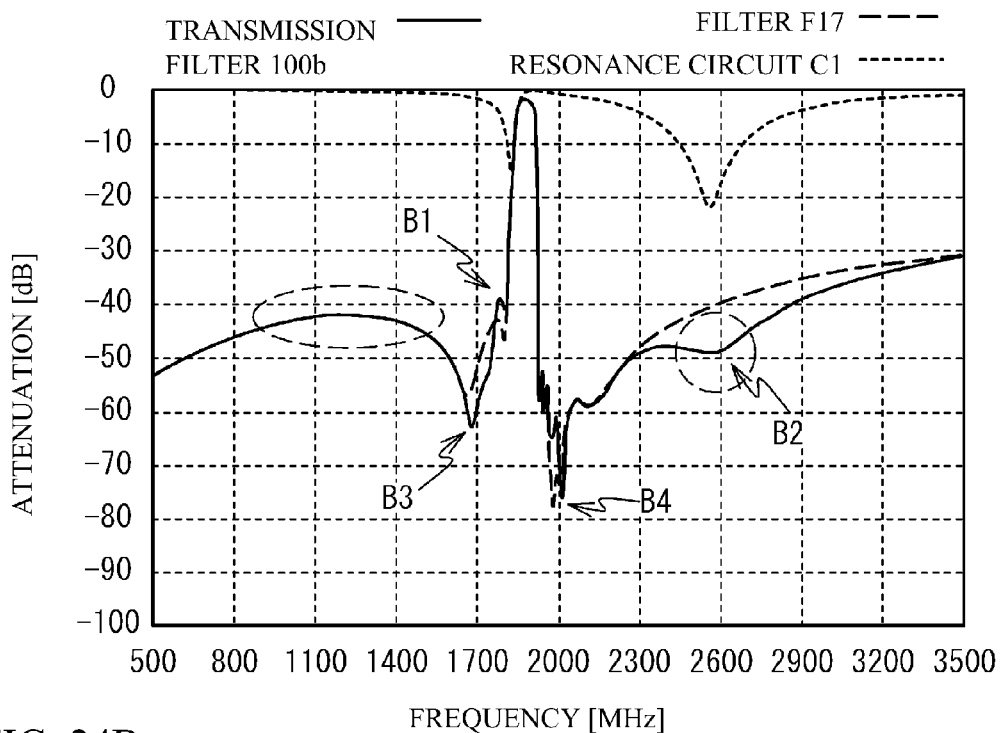
FIG. 24A is a diagram of an attenuation characteristic of a ladder filter in accordance with the first embodiment.
Figure 24B:
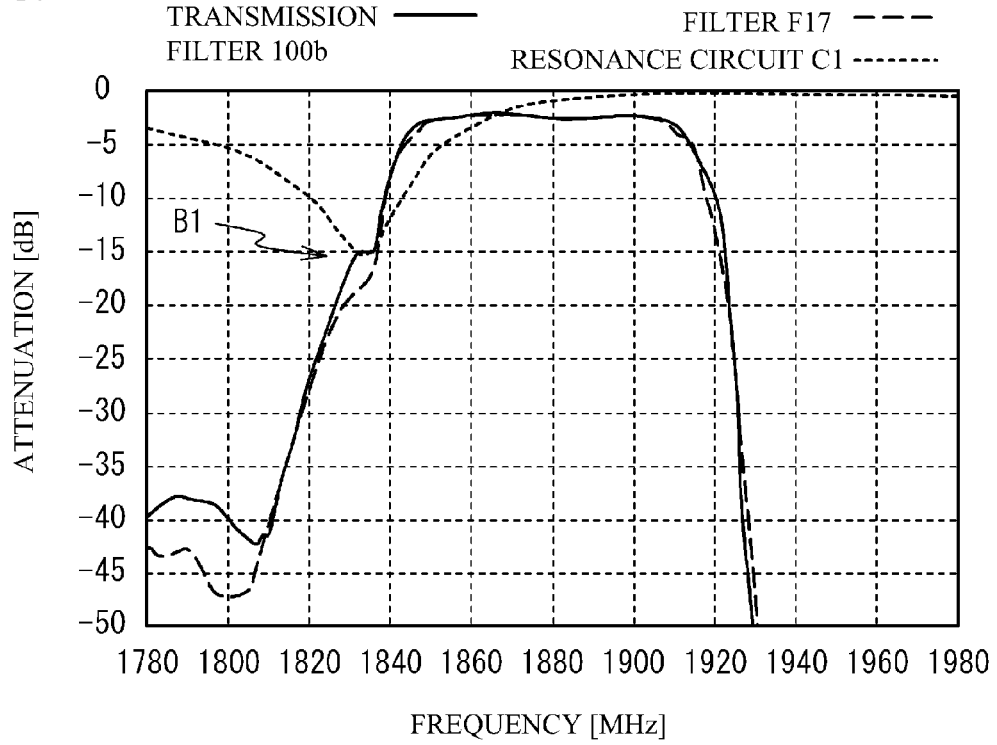
FIG. 24B is an enlarged view of a pass band illustrated in FIG. 24A.

FIG. 24A is a diagram of an attenuation characteristic of the ladder filter in accordance with the first embodiment. FIG. 24B is an enlarged diagram of a pass band illustrated in FIG. 24A. A solid line is the attenuation characteristic of the ladder filter (transmission filter 100b) in accordance with the first embodiment. A broken line is the attenuation characteristic of the filter F17 in accordance with the first comparative example. A dotted line is the attenuation characteristic of the resonance circuit C1 in accordance with the second comparative example.

As illustrated in FIGS. 24A and 24B. the transmission filter 100b and the filter F17 have respective pass bands. The lower ends of the pass bands are located at approximately 1800 MHz. The center frequencies of the pass bands are located at approximately 1880 MHz. For example, as illustrated in FIG. 2B, the low-frequency ends of the passbands depend on the resonance frequencies of the parallel resonators P1~P3. The center frequencies of the pass bands depend on the anti-resonance frequencies of the parallel resonators P1~P3.

As illustrated in FIGS. 24A and 24B, the resonance circuit C1 of the second embodiment has attenuation poles at the anti-resonance frequencies. This is like the case illustrated in FIG. 4D. As has been described, the transmission filter 100b includes the resonance circuit C1, that is, the series resonator Sx and the inductor Ls. Thus, the transmission filter 100b has attenuation poles at frequencies approximately equal to those of the resonance circuit C1. The attenuation pole at the low-frequency end (around 1830 MHz) is defined as a first attenuation pole B1, and the attenuation pole at the high-frequency end (around 2600 MHz) is defined as a second attenuation pole B2. The first attenuation pole B1 is located at a frequency higher than 1827 MHz that is the resonance frequency of the parallel resonator P3 that is the highest frequency among the parallel resonators P1~P3.

As surrounded by an ellipse in FIG. 24A, the transmission filter 100b of the first embodiment does not have deterioration of the suppression at the low-frequency area lower than the pass band. This is because the first attenuation pole B1 is formed at the low-frequency side of the low-frequency end of the pass band.

As indicated in FIG. 24A, the transmission filter 100b and the filter F17 have attenuation poles at around 1700 MHz and 2000 MHz. The attenuation pole around 1700 MHz is defined as a third attenuation pole B3, and the attenuation pole around 2000 MHz is defined as a fourth attenuation pole B4. The third attenuation pole B3 and the fourth attenuation pole B4 are generated by the parallel resonators P1~P3 and the inductors L1~L3 (see FIGS. 11B, 12B, 13B and 14B). In the filter F17, the suppression deteriorates in the high-frequency area equal to or higher than 2300 MHz. This is like the filter F14 in FIG. 12B and the filter F15 in FIG. 14B. As indicated by a circle in FIG. 24A, the transmission filter 100b has the second attenuation pole B2, whereby the suppression of the high-frequency area can be improved considerably.

The transmission filter 100b of the first embodiment includes the series resonators S11~Sx, the parallel resonators P1~P3 and the inductor Ls connected in parallel with the series resonator Sx. The series resonator Sx and the inductor Ls form the first attenuation pole B1 lower than the pass band, and the second attenuation pole B2 higher than the pass band. The first attenuation pole B1 is located at the frequency that is equal to higher than the resonance frequency of the parallel resonator P3 that is the highest among the parallel resonators P1~P3 and is equal to or lower than the high-frequency end of the pass band. It is thus possible to suppress in the low-frequency area. It is thus possible to obtain high suppression over the areas.

High suppression is obtained over the broad areas by compensating from deterioration of suppression in the high-frequency area by the second attenuation pole B2. In order to obtain high suppression in the high-frequency area, it is desired that the second attenuation pole B2 is formed at an appropriate frequency. By adjusting the frequency of the first attenuation pole B1, the position of the second attenuation pole B2 is also adjusted. As illustrated in FIG. 24A, the second attenuation pole B2 may be generated in an appropriate position in the high-frequency area by setting the frequency of the first attenuation pole B1 equal to or higher than that of the third attenuation pole B3 and equal to or lower than the high-frequency end of the pass band.

The first attenuation pole B1 is generated at a frequency equal to or lower than the pass band. In order to improve the suppression in the low-frequency area, the first attenuation pole B1 is located at a frequency that is equal to or higher than the resonance frequency of the parallel resonator P3 that is the highest among the parallel resonators P1~P3 and is equal to or lower than the high-frequency end of the pass band. In order to generate the second attenuation pole B2 in the high-frequency area, the first attenuation pole B1 is located at a frequency equal to or higher than the frequency of the third attenuation pole. However, the first attenuation pole B1 may increase the insertion loss in the pass band. Thus, it is preferable that the first attenuation pole B1 is located at a frequency lower than the center frequency of the pass band. In other words, it is preferable that the first attenuation pole B1 is located at a frequency lower equal to or lower than the anti-resonance frequency of the parallel resonator P3 having the highest resonance frequency. It is thus possible to suppress the insertion loss in the pass band from increasing and to maintain the characteristics of the filter well.

The first attenuation pole B1 may be located at a frequency higher than the resonance frequency of the parallel resonator P3 that is the highest or may be at a frequency higher than the frequency of the third attenuation pole B3. The first attenuation pole B1 may be located at a frequency lower than the high-frequency end of the pass band or may be located at a frequency lower than the anti-resonance frequency of the parallel resonator P3.

The first attenuation pole B1 formed by the series resonator Sx and the inductor Ls is located at a frequency lower than the pass band. Thus, the performance around the low-frequency end of the pass band is influenced greatly by the series resonator Sx and the inductor Ls. Generally, the Q value of the inductor is one or two digits smaller than that of the resonator. Therefore, the sharpness of the low-frequency end of the pass band may deteriorate. This deterioration may not ensure sufficient suppression in the pass band of another filter used along with the filter of interest. In order to suppress the influence of degraded suppression due to a low Q value, it is preferable that the ladder filter of the first embodiment is applied to the first filter included in the duplexer having the pass band lower than the pass band of the second filter in the duplexer. In the duplexer 100, the first embodiment is applied to the transmission filter 100b having the pass band lower than the pass band of the reception filter 100a (at the low-frequency side of the reception filter 100a). It is thus possible to suppress degradation of the suppression due to a low Q value and to obtain high suppression effectively. Further, by arranging the fourth attenuation pole B4 in the pass band of the reception filter 100a, the isolation characteristic of the duplexer 100 can be improved. The sharpness in the pass band is required in a system in which the transmission band and the reception band are close to each other such as the W-CDMA Band 2 system.

The first filter may be either the transmission filter or the reception filter. The application of the first filter may be determined on the basis of the communication system. The ladder filter of the first embodiment may be applied to both the filters of the duplexer or may be applied to the second filter only. In other words, the duplexer includes at least one ladder filter of the first embodiment.

The series resonance Sx and the inductor Ls generate the second attenuation pole B2 at the high-frequency side of the pass band. The parallel resonators P1~P3 and the inductors L1~L3 generate the third attenuation pole B3 at the low-frequency side of the pass band and the fourth attenuation pole B4 at the high-frequency side thereof. The use of the above attenuation poles makes it possible to improve the characteristic of the transmission filter 100b and that of the duplexer 100. For example, the second attenuation pole B2 may be arranged in a band used in wireless LAN (Local Area Network) and Bluetooth. The fourth attenuation pole B4 may be arranged in the pass band of the reception filter 100a, so that the attenuation characteristic of the duplexer 100 can be improved. Attenuation poles may be arranged in a band having second or third harmonics of the pass band.

The first embodiment is not limited to the ten series resonators and three parallel resonators described before, but may include an arbitrary number of resonators. For example, the first embodiment may include one or a plurality of series resonators and one or a plurality of parallel resonators. A plurality of series resonators and a plurality of inductors Ls may be connected in parallel. Besides the parallel resonator P1, the parallel resonator P2 or P3 may be connected in series to an inductor. At least one of the parallel resonators P1~P3 is connected to an inductor in series. By additionally providing a parallel arm composed of a parallel resonator and an inductor, a new attenuation pole may be generated.

The inductors L1, L2 and Ls are formed by the interconnection layers 120a~120d in the package substrate 120. Thus, the duplexer 100 may be downsized. The inductors La and Lr may be formed by the interconnection layers 120*a*~120*d*. The duplexer 100 may be further miniaturized.

The first embodiment is not limited to the SAW resonator but may use Love wave resonators, Lamb wave resonators, boundary acoustic wave resonators or piezoelectric thin-film resonators (FBAR).

Second Embodiment

Figure 25:
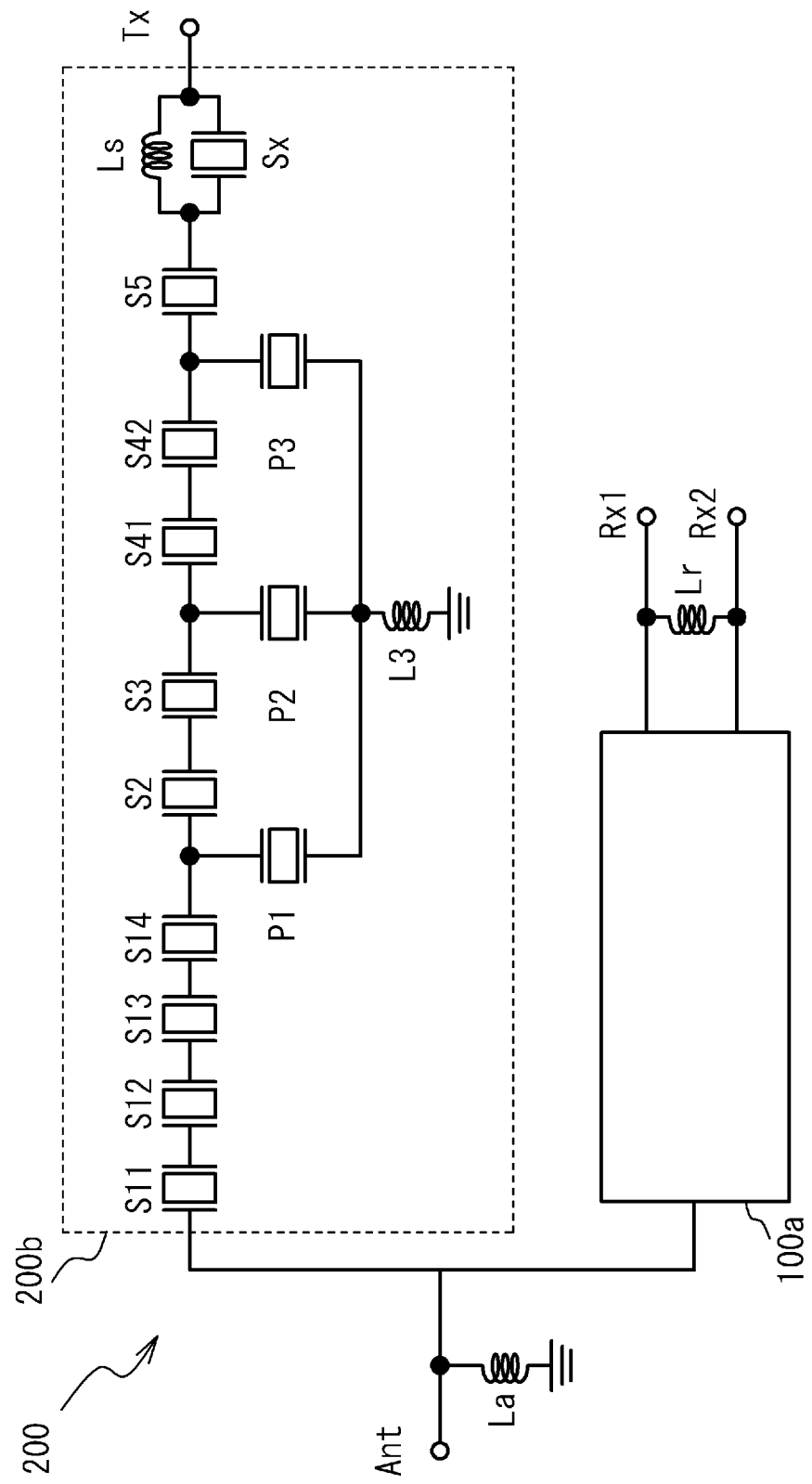
FIG. 25 is a circuit diagram of a duplexer in accordance with a second embodiment.

A second embodiment has a configuration in which one inductor is connected to parallel resonators. FIG. 25 is a circuit diagram of a duplexer in accordance with the second embodiment. Structural parts in FIG. 25 that are similar to those that have been described with reference to FIG. 18 is not described here.

Referring to FIG. 25, a duplexer 200 of the second embodiment includes a transmission filter 200*b*. The transmission filer 200*b* is a ladder filter of the second embodiment. The transmission filter 200*b* includes an inductor L3 (second inductor). One end of the inductor L3 is connected to one ends of the parallel resonators P1~P3, and the other ends thereof are grounded.

According to the second embodiment, high suppression is realized over broad frequency areas as in the case of the first embodiment. Like the attenuation characteristic of the filter F14 in FIG. 12B, the use of the inductor L3 results in an attenuation pole around the high-frequency end of the pass band. However, suppression in the high-frequency area may be degraded. According to the second embodiment, high suppression can be realized effectively in an area higher than the second attenuation pole B2.

Third Embodiment

Figure 26:
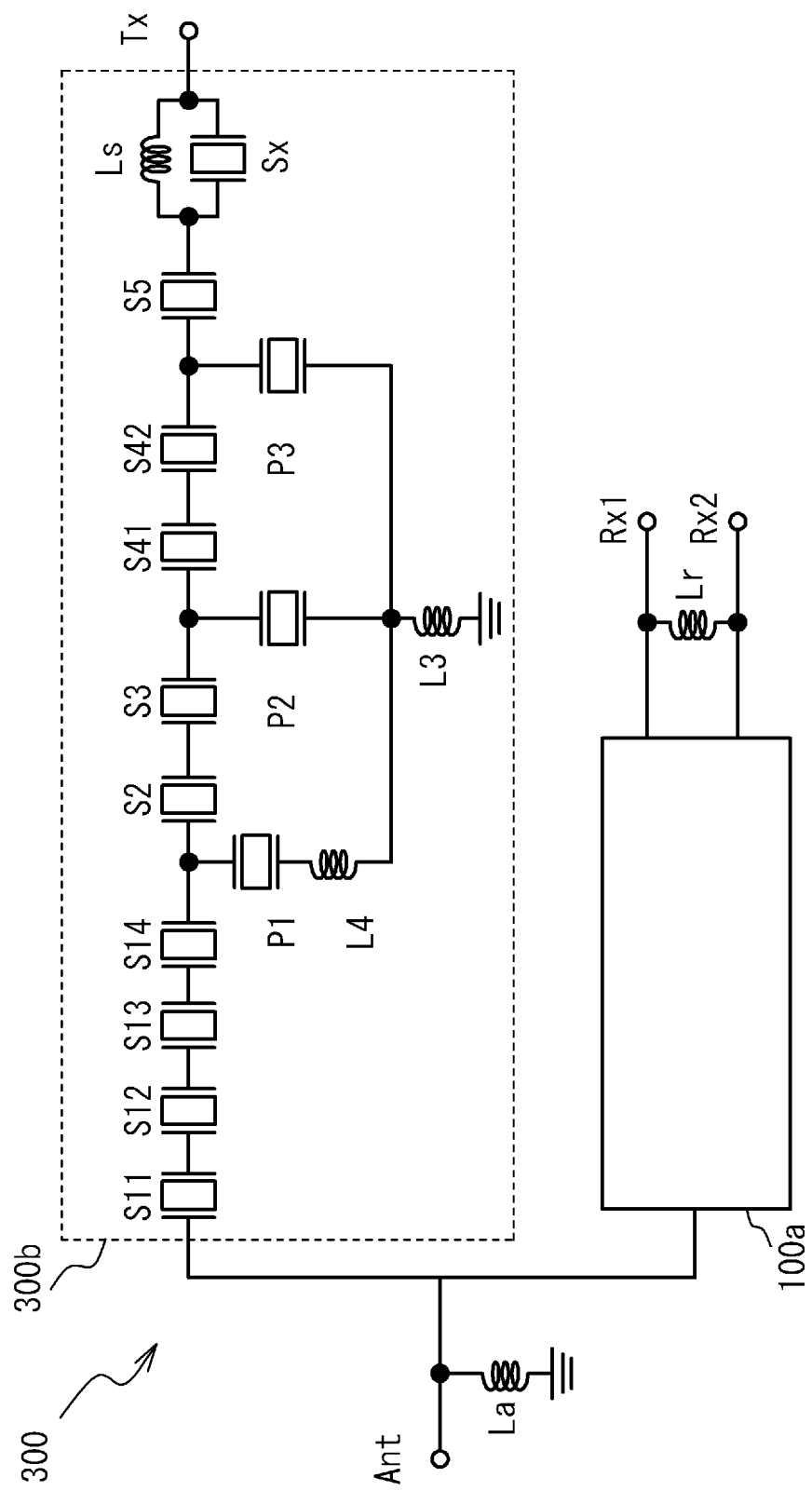
FIG. 26 is a circuit diagram of a duplexer in accordance with a third embodiment.

FIG. 26 is a circuit diagram of a duplexer in accordance with the third embodiment. In FIGS. 18 and 25, structural parts that have been described are not described here.

As illustrated in FIG. 26, a duplexer 300 of the third embodiment includes a transmission filter 300*b*. The transmission filter 300*b* is a ladder filter configured by adding an inductor L4 (third inductor) to the transmission filter 200*b*. The other end of the parallel resonator P1 is connected to one end of the inductor L4. The other end of the inductor L4 is connected to one end of the inductor L3. The inductor L4 is connected between the parallel resonator P1 and the inductor L3.

According to the third embodiment, high suppression is realized over board areas. The suppression in the high frequency area may be degraded greatly by providing the inductors L3 and L4 as in the case of the attenuation characteristic of the filter F15 illustrated in FIG. 14B. According to the third embodiment, high suppression can be realized in the high-frequency area higher than the second attenuation pole B2.

An inductor may be connected to the parallel resonator P2 or P3 in series. That is, the inductor is connected in parallel with at least one of the parallel resonators P1~P3.

Fourth Embodiment

Figure 27:
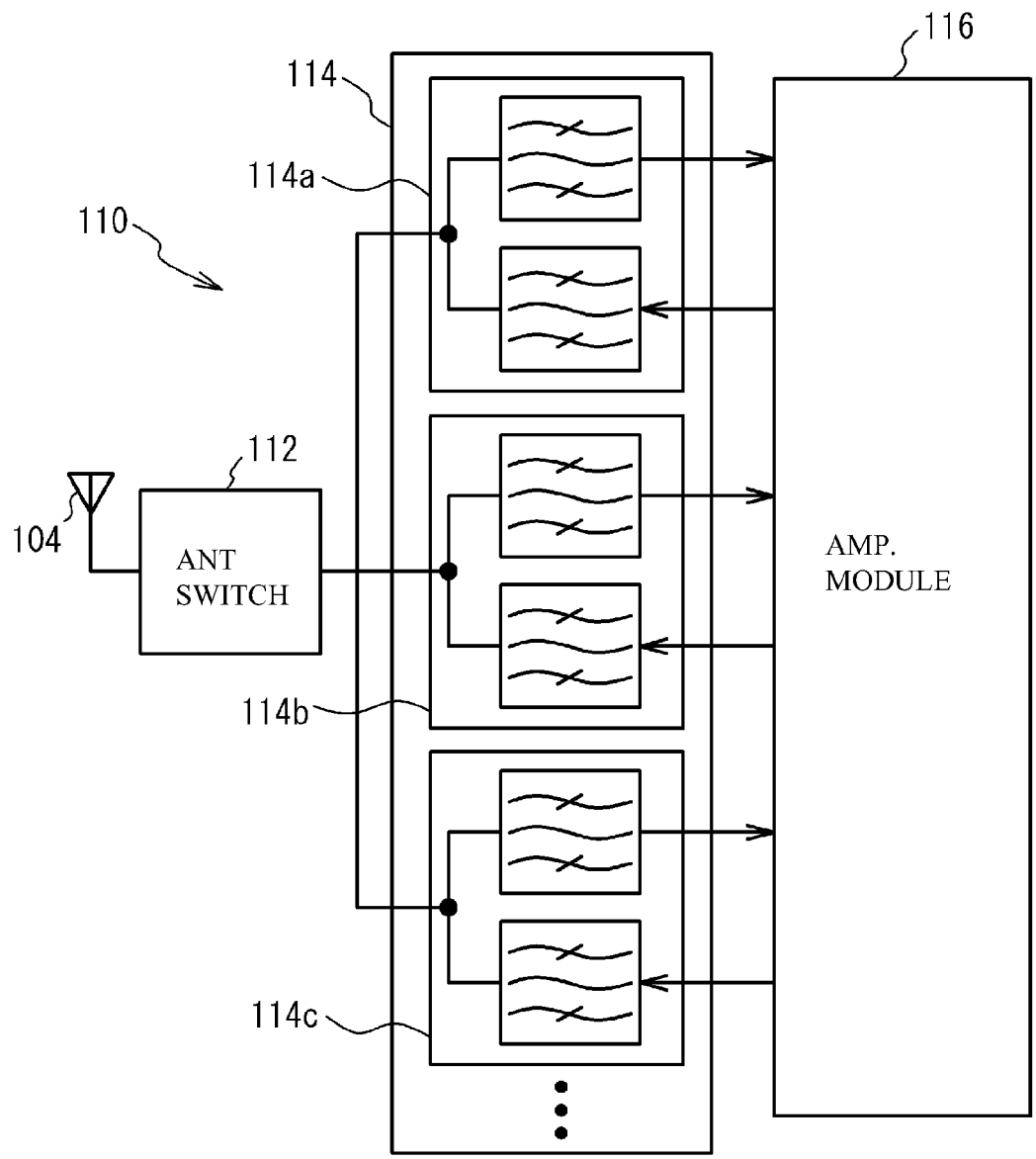
FIG. 27 is a block diagram of an RF module in accordance with a fourth embodiment.

A fourth embodiment is an exemplary RF filter with a ladder filter. FIG. 27 is a block diagram of an RF module in accordance with the fourth embodiment.

An RF module 110 includes the antenna 104, an antenna switch 112, a duplexer bank 114 and an amplifier module 116. The RF module 110 corresponds to a plurality of communication systems such as the GSM (Global System for Mobile Communication) system and the W-CDMA system, and is installed in the portable telephone or the like. The GSM system handles the 850 MHz band (GSM 850), 900 MHz band (GSM 900), 1800 MHz band (GSM 1800), and 1900 MHz band (GSM 1900). The antenna 104 is capable of handling the GSM system and the W-CDMA system. The duplexer bank 114 includes a plurality of duplexers 114*a*, 114*b* and 114*c*. Each of the duplexers corresponds to one of the communication systems. The duplexer bank 114 may have two duplexers or more than three duplexers. The antenna switch 112 selects the duplexer that conforms to the communication system used for signal transmission and reception from among the duplexers of the duplexer bank 114, and makes a connection between the selected duplexer and the antenna 104. The duplexers 114*a*, 114*b* and 114*c* of the duplexer bank 114 are connected to the amplifier module 116. The amplifier module 116 amplifies the signals received by the reception filters of the duplexers 114*a*~114*c*, and outputs a next-stage processing part. Further, the amplifier module 116 amplifiers signals generated by a processing part (not illustrated), and outputs the amplified signals to the transmission filters of the duplexers 114*a*~114*c*.

Instead of the printed-circuit board 130 illustrated in FIG. 19C, the RF module 110 may have a module board on which multiple duplexer chips 101 are mounted.

At least one of the multiple duplexers 114*a*~114*c* is the duplexer in accordance with one of the first through third embodiments. The fourth embodiment is capable of realizing high suppression over broad areas. The fourth embodiment includes a module other than the RF module. Multiple filters that are mounted on a single or common module board and are capable of handling multiple bands can ensure sufficient suppression over broad areas and can realize improved characteristics effectively.

The present invention is not limited to the specifically disclosed embodiments but may include other embodiments and variations without departing from the scope of the present invention.

What is claimed is:

1. A module including at least one ladder filter comprising:
   at least one series resonator connected in series between an input terminal and an output terminal;
   at least one parallel resonator connected in parallel with the at least one series resonator; and
   an inductor connected in parallel with the at least one series resonator,
   the at least one series resonator and the inductor generating a first attenuation pole at a frequency equal to or lower than a pass band defined by the at least one series resonator and the at least one parallel resonator,
   the first attenuation pole being located at a frequency that is higher than a resonance frequency of a parallel resonator that is included in the at least one parallel resonator and has a highest resonance frequency and that is equal to or lower than a high-frequency end of the pass band.

2. A module including at least one ladder filter comprising:
   at least one series resonator connected in series between an input terminal and an output terminal;
   at least one parallel resonator connected in parallel with the at least one series resonator; and
   a first inductor connected in parallel with the at least one series resonator;
   a second inductor connected in series between the at least one parallel resonator and a ground terminal,
   the at least one series resonator and the first inductor generating a first attenuation pole at a frequency equal to or lower than a pass band defined by the at least one series resonator and the at least one parallel resonator, and a second attenuation pole at a frequency higher than the pass band,
   the at least one parallel resonator and the second inductor generating a third attenuation pole at a frequency lower than the pass band, and a fourth attenuation pole at a frequency higher than the pass band, the frequency of the first attenuation pole being equal to or higher than the frequency at which the third attenuation pole appears and being equal to or lower than a high-frequency end of the pass band.

3. A ladder filter comprising:
at least one series resonator connected in series between an input terminal and an output terminal;
at least one parallel resonator connected in parallel with the at least one series resonator; and
a first inductor connected in parallel with the at least one series resonator;
a second inductor connected in series between the at least one parallel resonator and a ground terminal,
the at least one series resonator and the first inductor generating a first attenuation pole at a frequency equal to or lower than a pass band defined by the at least one series resonator and the at least one parallel resonator, and a second attenuation pole at a frequency higher than the pass band,
the at least one parallel resonator and the second inductor generating a third attenuation pole at a frequency lower than the pass band, and a fourth attenuation pole at a frequency higher than the pass band,
the frequency of the first attenuation pole being higher than the frequency at which the third attenuation pole appears and being equal to or lower than a high-frequency end of the pass band.

4. The ladder filter according to claim 3, wherein the frequency at which the first attenuation pole appears is equal to or lower than an anti-resonance frequency of the parallel resonator having the highest resonance frequency.

5. The ladder filter according to claim 3, wherein the second inductor has an end connected to all of the at least one parallel resonator, and another end grounded.

6. The ladder filter according to claim 4, wherein the second inductor has an end connected to all of the at least one parallel resonator, and another end grounded.

7. The ladder filter according to claim 5, further comprising a third inductor connected in series between the at least one parallel resonator and the second inductor.

8. The ladder filter according to claim 6, further comprising a third inductor connected in series between the at least one parallel resonator and the second inductor.

9. The ladder filter according to claim 3, wherein the at least one series resonator and the first inductor generate the first attenuation pole at a frequency lower than the pass band.

10. A ladder filter comprising:
at least one series resonator connected in series between an input terminal and an output terminal;
at least one parallel resonator connected in parallel with the at least one series resonator; and
an inductor connected in parallel with the at least one series resonator,
the at least one series resonator and the inductor generating a first attenuation pole at a frequency equal to or lower than a pass band defined by the at least one series resonator and the at least one parallel resonator,
the first attenuation pole being located at a frequency that is higher than a resonance frequency of a parallel resonator that is included in the at least one parallel resonator and has a highest resonance frequency and that is equal to or lower than a high-frequency end of the pass band.

11. The ladder filter according to claim 10, wherein the frequency at which the first attenuation pole appears is equal to or lower than an anti-resonance frequency of the parallel resonator having the highest resonance frequency.

12. The ladder filter according to claim 10, wherein the resonance frequency of the parallel resonator that is included in the at least one parallel resonator and has a highest resonance frequency is a resonance frequency without an inductor.

13. The ladder filter according to claim 10, wherein the at least one series resonator and the inductor generate the first attenuation pole at a frequency lower than the pass band.

14. A duplexer having filters, at least one of the filters being a ladder filter comprising:
at least one series resonator connected in series between an input terminal and an output terminal;
at least one parallel resonator connected in parallel with the at least one series resonator; and
an inductor connected in parallel with the at least one series resonator,
the at least one series resonator and the inductor generating a first attenuation pole at a frequency equal to or lower than a pass band defined by the at least one series resonator and the at least one parallel resonator,
the first attenuation pole being located at a frequency that is higher than a resonance frequency of a parallel resonator that is included in the at least one parallel resonator and has a highest resonance frequency and that is equal to or lower than a high-frequency end of the pass band.

15. The duplexer according to claim 14, wherein the filters include a first filter connected between a common terminal and a first terminal, and a second filter connected between the common terminal and a second terminal,
the second filter having a pass band having frequencies higher than those of that of the first filter,
the first filter being the ladder filter.

16. A duplexer having filters, at least one of the filters being a ladder filter comprising:
at least one series resonator connected in series between an input terminal and an output terminal;
at least one parallel resonator connected in parallel with the at least one series resonator; and
a first inductor connected in parallel with the at least one series resonator;
a second inductor connected in series between the at least one parallel resonator and a ground terminal,
the at least one series resonator and the first inductor generating a first attenuation pole at a frequency equal to or lower than a pass band defined by the at least one series resonator and the at least one parallel resonator, and a second attenuation pole at a frequency higher than the pass band,
the at least one parallel resonator and the second inductor generating a third attenuation pole at a frequency lower than the pass band, and a fourth attenuation pole at a frequency higher than the pass band,
the frequency of the first attenuation pole being higher than the frequency at which the third attenuation pole appears and being equal to or lower than a high-frequency end of the pass band.

17. The duplexer according to claim 16, wherein the filters include a first filter connected between a common terminal and a first terminal, and a second filter connected between the common terminal and a second terminal,
the second filter having a pass band having frequencies higher than those of that of the first filter,
the first filter being the ladder filter.

* * * * *